(12) United States Patent
Anthony

(10) Patent No.: US 6,636,406 B1
(45) Date of Patent: Oct. 21, 2003

(54) UNIVERSAL MULTI-FUNCTIONAL COMMON CONDUCTIVE SHIELD STRUCTURE FOR ELECTRICAL CIRCUITRY AND ENERGY CONDITIONING

(75) Inventor: Anthony A. Anthony, Erie, PA (US)

(73) Assignee: X2Y Attenuators, LLC, Santa Monica, CA (US)

( * ) Notice: Subject to any disclaimer, the term of this patent is extended or adjusted under 35 U.S.C. 154(b) by 0 days.

(21) Appl. No.: 09/594,447

(22) Filed: Jun. 15, 2000

Related U.S. Application Data

(63) Continuation-in-part of application No. 09/600,530, filed as application No. PCT/US99/01040 on Jan. 16, 1999, which is a continuation-in-part of application No. 09/579,606, filed on May 26, 2000, which is a continuation-in-part of application No. 09/460,218, filed on Dec. 13, 1999, which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350.

(60) Provisional application No. 60/139,182, filed on Jun. 15, 1999, provisional application No. 60/146,987, filed on Aug. 3, 1999, provisional application No. 60/165,035, filed on Nov. 12, 1999, provisional application No. 60/180,101, filed on Feb. 3, 2000, provisional application No. 60/185,320, filed on Feb. 28, 2000, provisional application No. 60/191,196, filed on Mar. 22, 2000, provisional application No. 60/200,327, filed on Apr. 28, 2000, and provisional application No. 60/203,863, filed on May 12, 2000.

(51) Int. Cl.$^7$ ................................................. H02H 9/00
(52) U.S. Cl. ...................... 361/118; 301/56; 301/58; 301/91.1
(58) Field of Search ............... 361/56, 58, 91.1, 361/113, 115, 117, 118, 119, 127

(56) References Cited

U.S. PATENT DOCUMENTS 3,573,677 A * 4/1971 Detar ........................ 333/79
3,842,374 A 10/1974 Schlicke (List continued on next page.)

FOREIGN PATENT DOCUMENTS

| DE | 198 57 043 C1 | 3/2000 |
| EP | 0933871 | 8/1999 |

(List continued on next page.)

OTHER PUBLICATIONS

PCT International Search Report for International Application No. PCT/US/98/06962 Aug. 19, 1998.

(List continued on next page.)

*Primary Examiner*—Stephen W. Jackson
(74) *Attorney, Agent, or Firm*—Hahn Loeser & Parks, LLP; Robert J. Clark

(57) ABSTRACT

The present invention relates to a layered universal, multi-functional, common conductive shield structure with conductive pathways for energy and EMI conditioning and protection that also possesses a commonly shared and centrally positioned conductive pathway or electrode of the structure that can simultaneously shield and allow smooth energy interaction between grouped and energized conductive pathway electrodes. The invention, when energized, will allow the contained conductive pathways or electrodes to operate with respect to one another harmoniously, yet in an oppositely phased or charged manner, respectively. The invention will also provide EMI filtering and surge protection while maintaining apparent even or balanced voltage supply between a source and an energy utilizing-load when placed into a circuit and energized. The invention will also be able to simultaneous and effectively provide energy conditioning functions that include bypassing, energy and signal decoupling, energy storage, continued balance in SSO (Simultaneous Switching Operations) states and all without contributing disruptive energy parasitics back into the circuit system as the invention is passively operated, within.

15 Claims, 9 Drawing Sheets

U.S. PATENT DOCUMENTS

| | | |
|---|---|---|
| 4,262,317 A | 4/1981 | Baumbach |
| 4,308,509 A | 12/1981 | Tsuchiya et al. |
| 4,335,417 A | 6/1982 | Sakshaug et al. |
| 4,353,044 A | 10/1982 | Nossek |
| 4,366,456 A | 12/1982 | Ueno et al. |
| 4,587,589 A | 5/1986 | Marek |
| 4,682,129 A | 7/1987 | Bakermans et al. |
| 4,772,225 A | 9/1988 | Ulery |
| 5,079,069 A | 1/1992 | Howard et al. |
| 5,140,497 A | 8/1992 | Kato et al. |
| 5,142,430 A | 8/1992 | Anthony |
| 5,155,655 A | 10/1992 | Howard et al. |
| 5,161,086 A | 11/1992 | Howard et al. |
| 5,181,859 A | 1/1993 | Foreman et al. |
| 5,236,376 A | 8/1993 | Cohen |
| 5,243,308 A | 9/1993 | Shusterman et al. |
| 5,251,092 A | 10/1993 | Brady et al. |
| 5,261,153 A | 11/1993 | Lucas |
| 5,268,810 A | 12/1993 | DiMarco et al. |
| 5,290,191 A | 3/1994 | Foreman et al. |
| 5,321,373 A | 6/1994 | Shusterman et al. |
| 5,321,573 A | 6/1994 | Person et al. |
| 5,337,028 A | 8/1994 | White |
| 5,353,189 A | 10/1994 | Tomlinson |
| 5,396,201 A | 3/1995 | Ishizaki et al. |
| 5,414,587 A | 5/1995 | Kiser et al. |
| 5,455,734 A | 10/1995 | Foreman et al. |
| 5,483,407 A | 1/1996 | Anastasio et al. |
| 5,491,299 A * | 2/1996 | Naylor ................. 174/36 |
| 5,500,629 A | 3/1996 | Meyer |
| 5,512,196 A | 4/1996 | Mantese et al. |
| 5,555,150 A | 9/1996 | Newman et al. |
| 5,568,348 A | 10/1996 | Foreman et al. |
| 5,592,391 A | 1/1997 | Muyshondt et al. |
| 5,751,539 A | 5/1998 | Stevenson et al. |
| 5,828,093 A | 10/1998 | Naito et al. |
| 5,838,216 A | 11/1998 | White et al. |
| 5,880,925 A | 3/1999 | DuPre et al. |
| 5,889,445 A | 3/1999 | Ritter et al. |
| 5,909,350 A | 6/1999 | Anthony |
| 6,018,448 A | 1/2000 | Anthony |
| 6,034,864 A | 3/2000 | Naito et al. |
| 6,038,121 A | 3/2000 | Naito et al. |
| 6,072,687 A | 6/2000 | Naito et al. |
| 6,097,581 A | 8/2000 | Anthony |

FOREIGN PATENT DOCUMENTS

| | | |
|---|---|---|
| FR | 2765417 | 12/1998 |
| JP | 3-18112 | 1/1991 |
| JP | 6-53048 | 2/1994 |
| JP | 6-53049 | 2/1994 |
| JP | 6-53075 | 2/1994 |
| JP | 6-53077 | 2/1994 |
| JP | 6-53078 | 2/1994 |
| JP | 6-84695 | 3/1994 |
| JP | 6-151014 | 5/1994 |
| JP | 6-151244 | 5/1994 |
| JP | 6-151245 | 5/1994 |
| JP | 6-325977 | 11/1994 |
| JP | 7-235406 | 9/1995 |
| JP | 7-235852 | 9/1995 |
| JP | 7-240651 | 9/1995 |
| JP | 8-124795 | 5/1996 |
| JP | 8-172025 | 7/1996 |
| JP | 11-214256 | 8/1999 |
| WO | WO 00/16446 | 3/2000 |

OTHER PUBLICATIONS

PCT International Search Report for International Application No. PCT/US99/01040 Apr. 19, 1999.

PCT International Search Report for International Application No. PCT/US99/07653 Jul. 19, 1999.

PCT International Search Report for International Application No. PCT/US00/11409 Sep. 18, 2000.

PCT International Search Report for International Application No. PCT/US00/14626 Sep. 13, 2000.

PCT International Search Report for International Application No. PCT/US00/16518 Nov. 8, 2000.

* cited by examiner

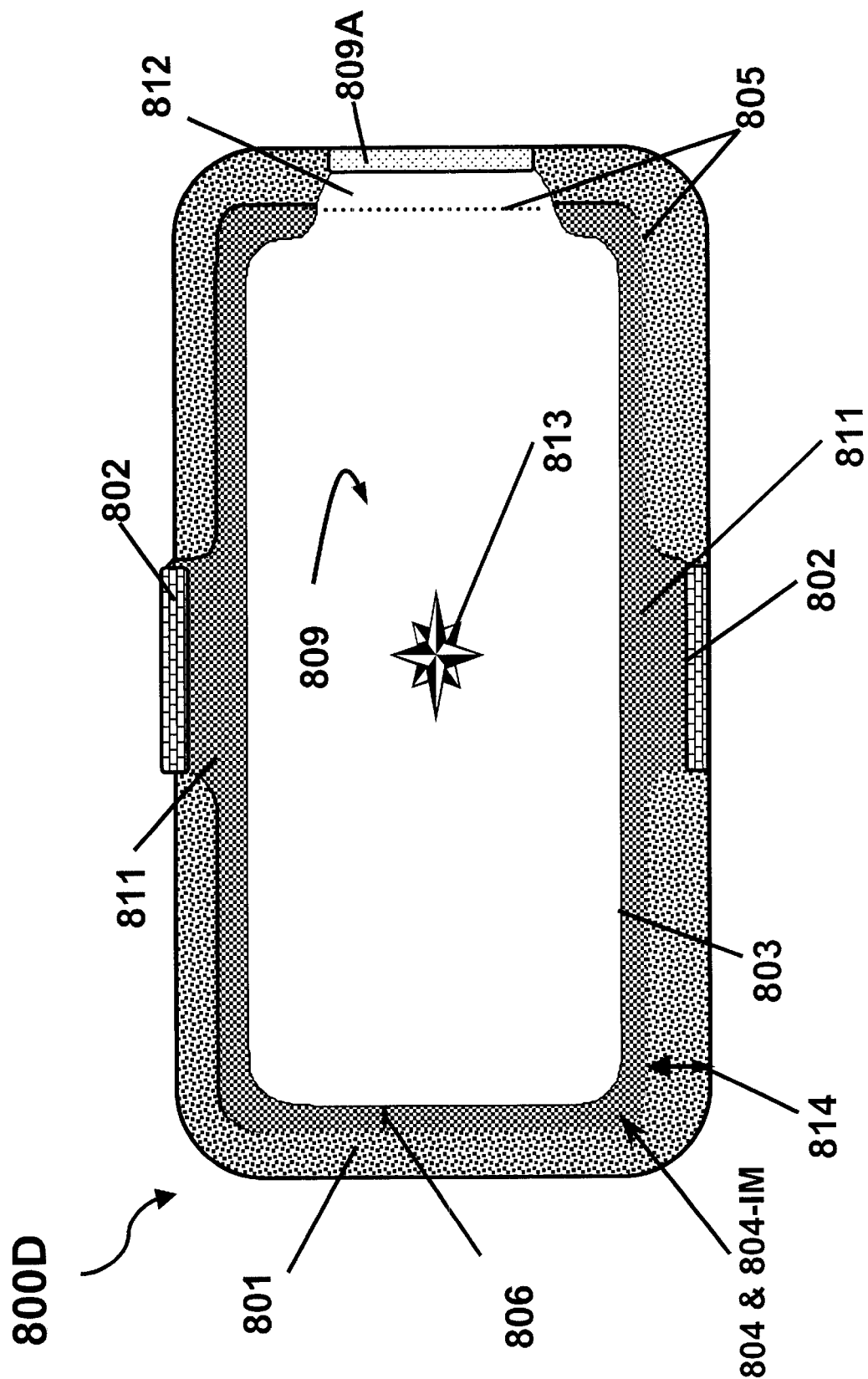

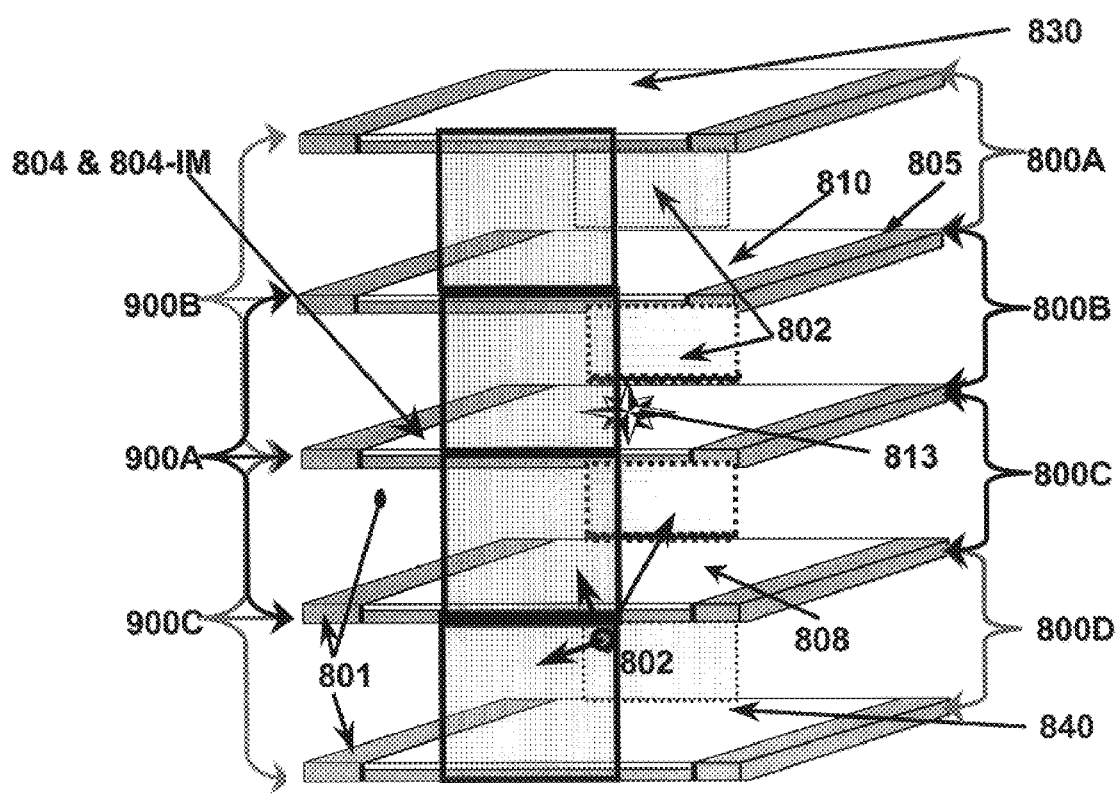

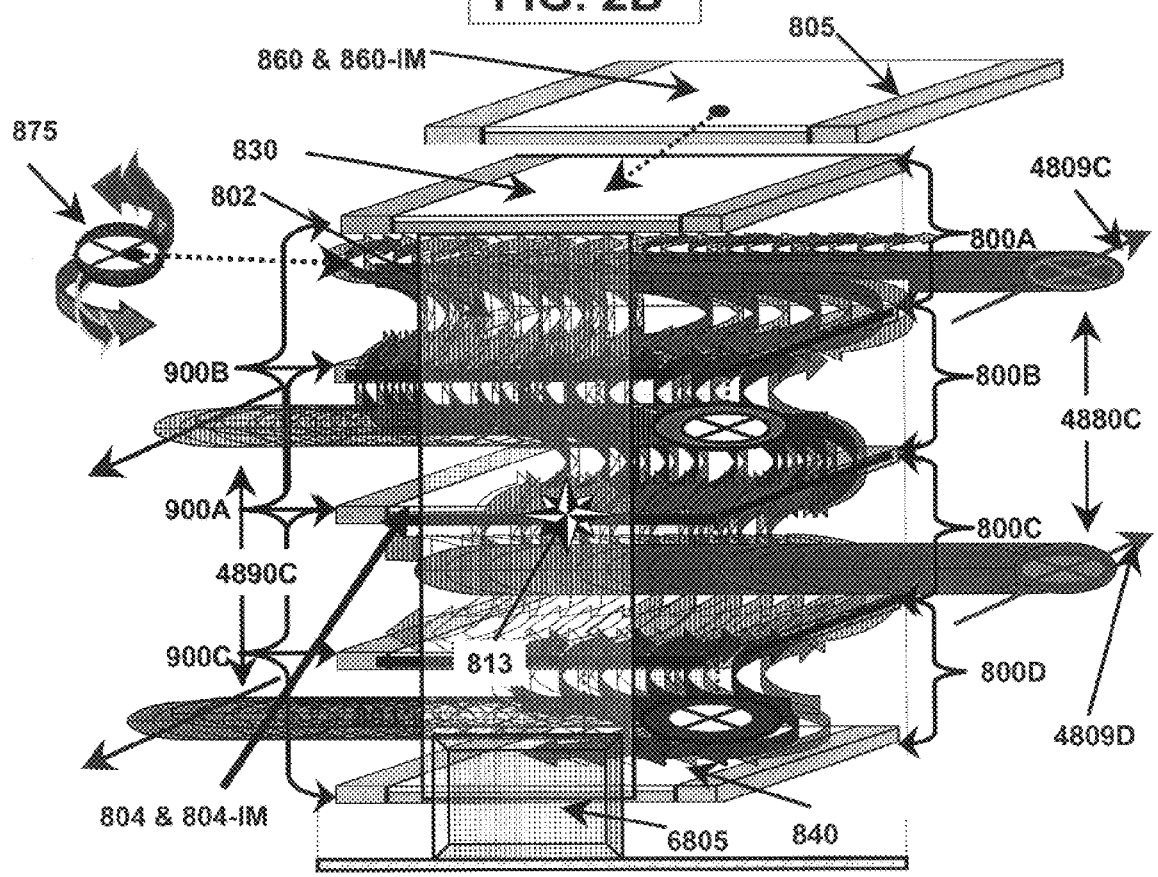

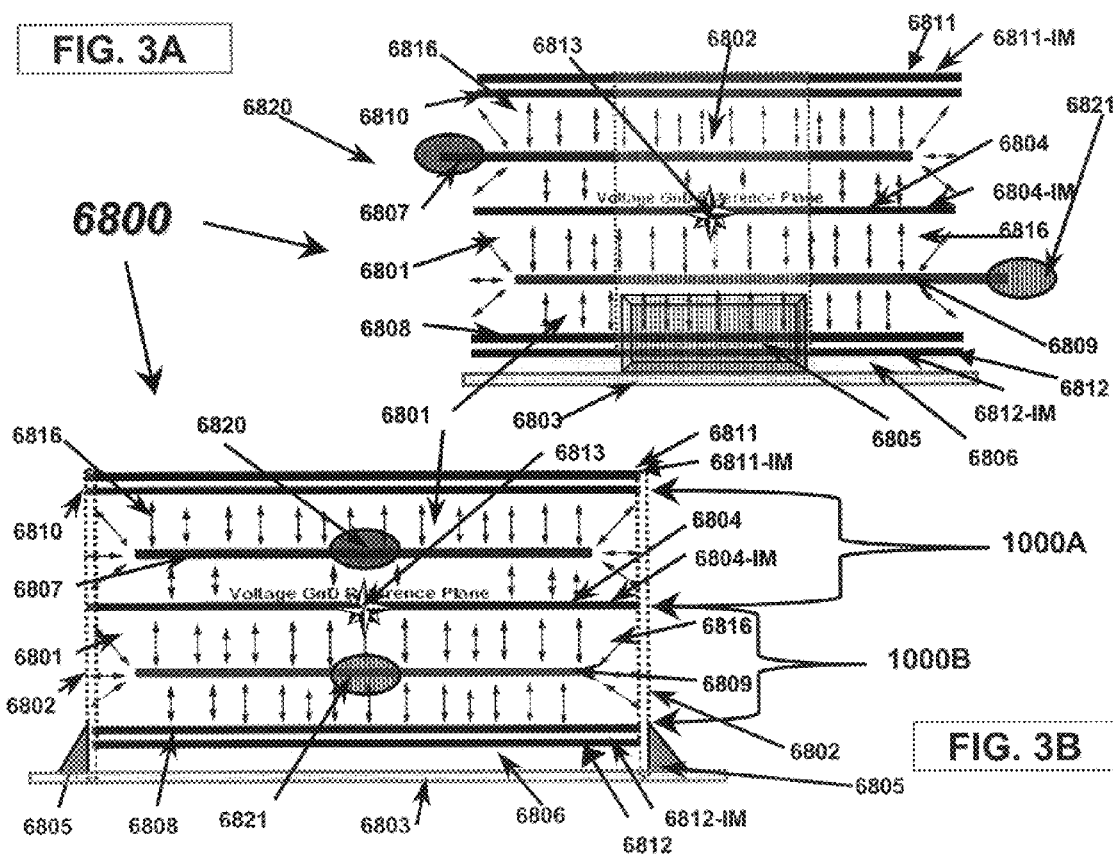

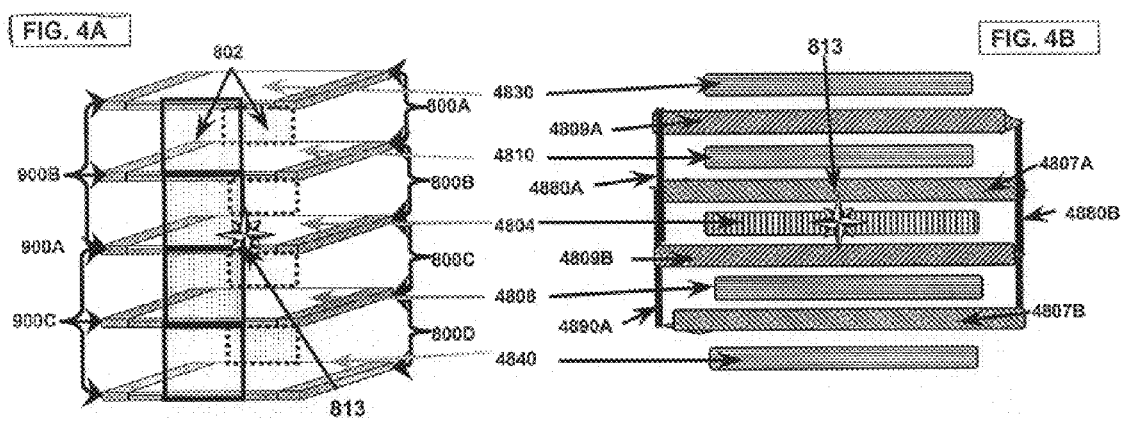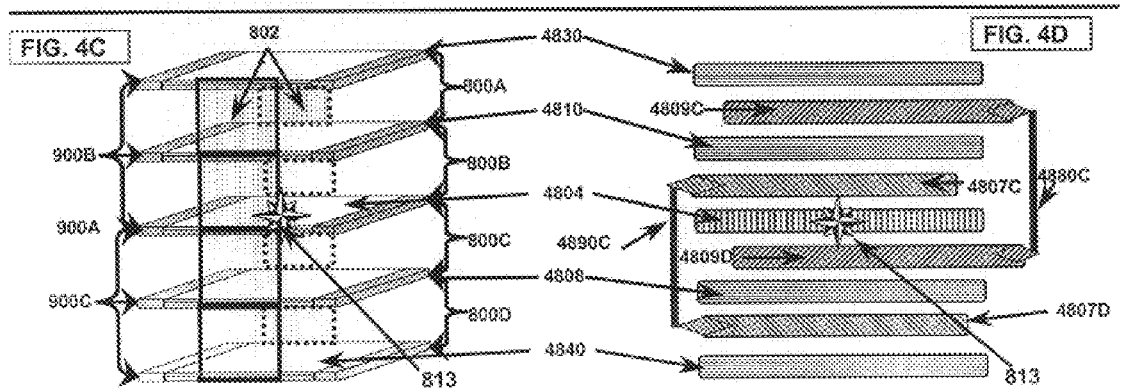

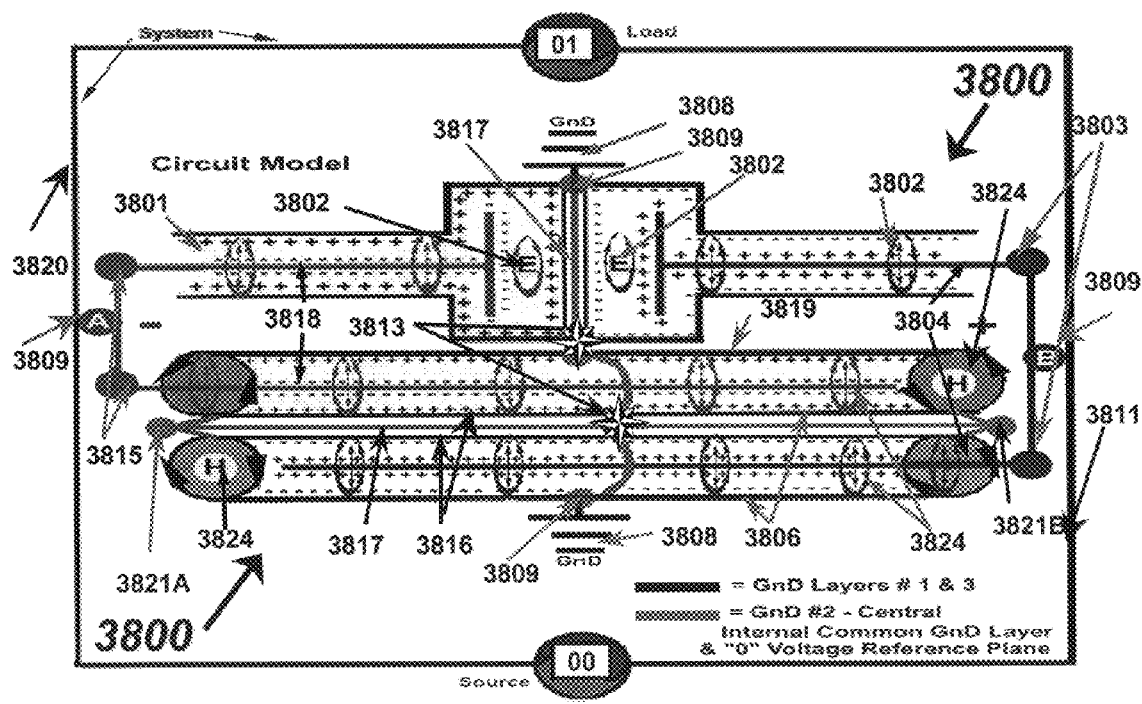

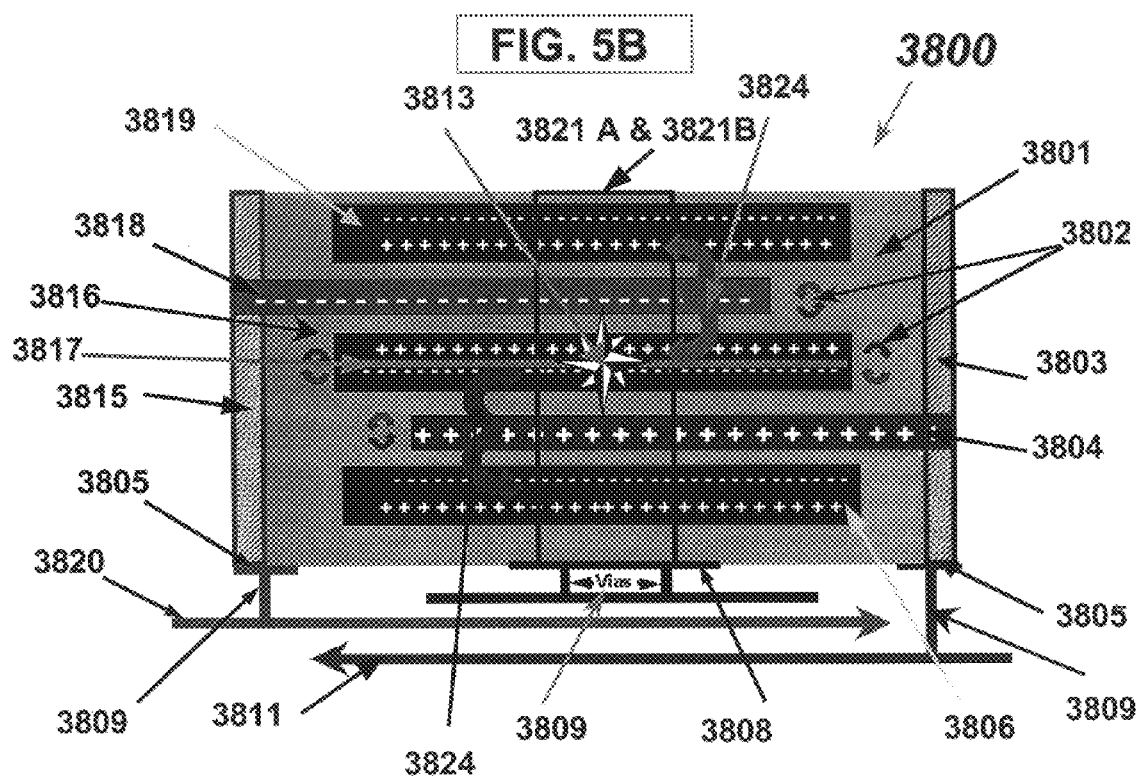

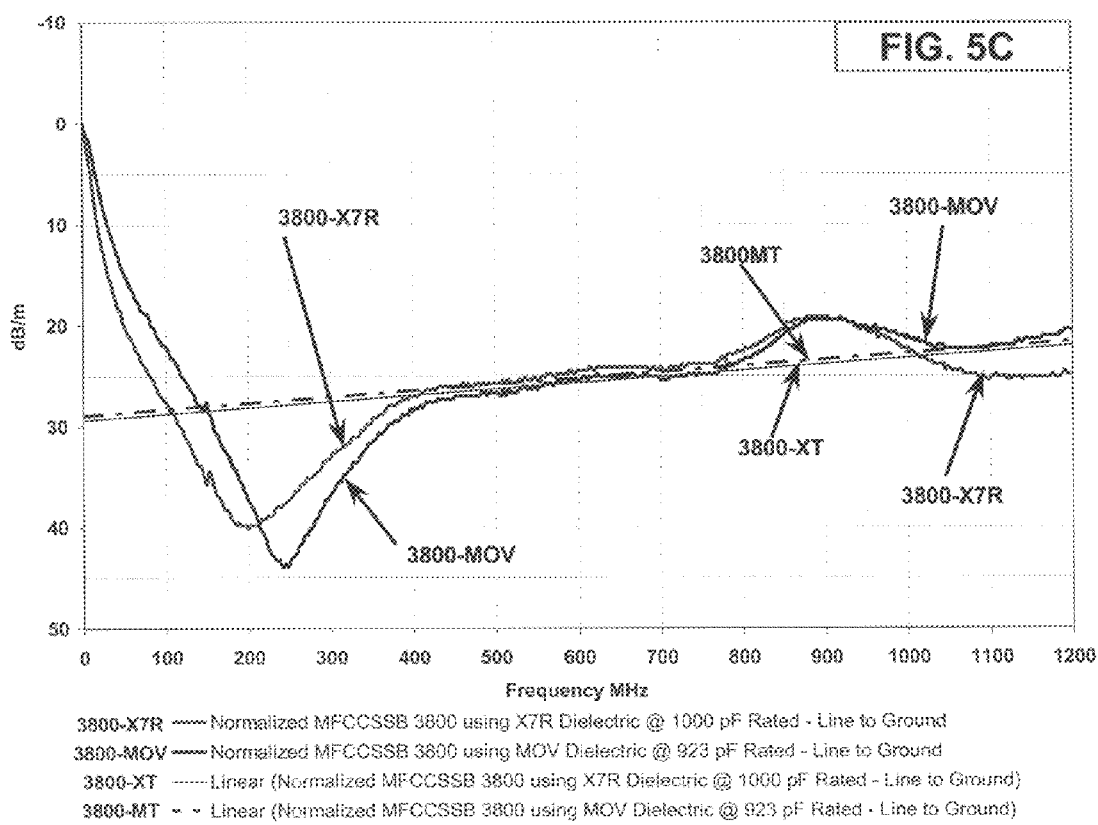

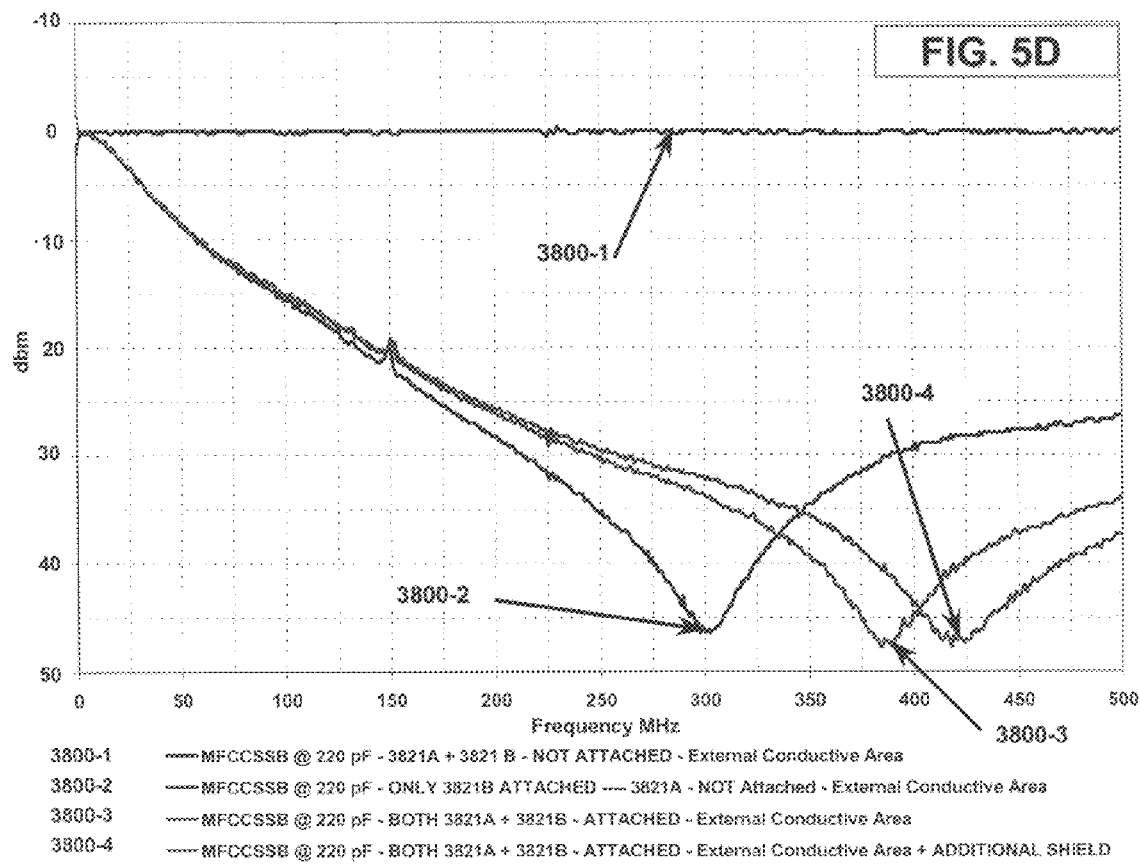

UNIVERSAL MULTI-FUNCTIONAL COMMON CONDUCTIVE SHIELD STRUCTURE FOR ELECTRICAL CIRCUITRY AND ENERGY CONDITIONING

This application is a continuation-in-part of co-pending application Ser. No. 09/600,530 filed Jul. 18, 2000, which is a U.S. national stage application of international application PCT/US99/01040 filed Jan. 16, 1999; this application is also a continuation-in-part of copending application Ser. No. 09/579,606 filed May 26, 2000 which is a continuation-in-part of copending application Ser. No. 09/460,218 filed Dec. 13, 1999, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998 now U.S. Pat. No. 6,097,581, which is a continuation-in-part of application Ser. No. 08/841,940 filed Apr. 8, 1997, now issued as U.S. Pat. No. 5,909,350. This application also claims the benefit of U.S. Provisional Application No. 60/139,182 filed Jun. 15, 1999, U.S. Provisional Application No. 60/146,987 filed Aug. 3, 1999, U.S. Provisional Application No. 60/165,035 filed Nov. 12, 1999, U.S. Provisional Application No. 60/180,101 filed Feb. 3, 2000, U.S. Provisional Application No. 60/185,320 filed Feb. 28, 2000, U.S. Provisional Application No. 60/191,196 filed Mar. 22, 2000, U.S. Provisional Application No. 60/200,327 filed Apr. 28, 2000, and U.S. Provisional Application No. 60/203,863 filed May 12, 2000.

TECHNICAL FIELD

BACKGROUND OF THE INVENTION

The present invention relates to a layered, universal, multi-functional common conductive shield structure with conductive feed-thru or by-pass pathways for circuitry and energy conditioning that also possesses a commonly shared and centrally positioned conductive pathway or electrode that can simultaneously shield and allow smooth energy interaction between grouped and energized conductive pathway electrodes. The invention, when energized, will allow the contained conductive pathways or electrodes to operate with respect to one another harmoniously, yet in an oppositely phased or charged manner, respectively. When placed into a circuit and energized, the invention will also provide EMI filtering and surge protection while maintaining an apparent even or balanced voltage supply between a source and an energy utilizing-load. The invention will also be able to simultaneous and effectively provide energy conditioning functions that include bypassing, energy and signal decoupling, energy storage, and continued balance in Simultaneous Switching Operations (SSO) states of integrated circuit gate. These conditioning functions are all provided without contributing disruptive energy parasitics back into the circuit system as the invention is passively operated within the circuit.

Electrical systems have undergone short product life cycles over the last decade. A system built just two years ago can be considered obsolete to a third or fourth generation variation of the same application. Accordingly, passive componentry and circuitry built into these the systems need to evolve just as quickly. However, the evolvement of passive componentry has not kept pace. The performance of a computer or other electronic systems has typically been constrained by the frequency operating speed of its slowest active elements. Until recently, those elements were the microprocessor and the memory components that controlled the overall system's specific functions and calculations. However, with the advent of new generations of microprocessors, memory components and their data, the focus has changed. There is now intense pressure upon the industry to provide the system user with increased processing power and speed at a decreasing unit cost. EMI created in these environments must also be eliminated or minimized to meet international emission and/or susceptibility requirements. Since 1980, the typical operating frequency of the mainstream microprocessors has increased approximately 240 times, from 5 MHz (million cycles per second) to approximately to 1200 MHz+ by the end of the year 2000. Processor frequency operating speed is now matched by the development and deployment of ultra-fast RAM architectures. These breakthroughs have allowed boosting of overall system frequency operating speeds of the active componentry past the 1 GHz mark. During this same period, however, passive componentry technologies have failed to keep up with these new breakthroughs and have produced only incremental changes in composition and performance. These advances in passive component design and changes have focused primarily upon component size reduction, slight modifications of discrete component electrode layering, dielectric discoveries, and modifications of device manufacturing techniques or rates of production that decrease unit production cycle times.

In the past, system engineers have solved design problems by increasing the number of passive components placed into the electrical circuit. These solutions generally have involved adding inductors and resistors that are used with prior art capacitors to perform separate functions such as filtering, decoupling, and surge protection. Although there have been a few devices that are able to perform more than one function simultaneously, these devices consist of passive networks that require additional supporting componentry.

Not to be overlooked, however, is the existence of a major limitation in the line conditioning ability of these passive networks and prior art single passive components. This limitation presents both an obstacle for technological progression and an obstacle for economic growth in the electronic and computer industry and remains as one of the last remaining challenges of the +GHz speed systems. The focus of constraint to high-speed system performance is centered upon the physical architectural limitations that make-up the supporting passive componentry that in turn helps deliver and condition the propagated energy and data signals going to and from the processors, memory technologies, and those additional systems located outside of a particular electronic system.

A single passive component generally has a physical functional line conditioning limitation of between 5 and 250 MHz. At higher frequencies, for the most part, a load still requires combinations of discrete passive elements for "lump" elements such as various L-C-R, L-C, and R-C networks to shape or control energy delivered to the system load. However, at frequencies above 200–250 MHz, these prior art, discrete L-C-R, L-C, R-C networks begin to take on characteristics of transmission lines and even microwave-like features rather than providing lump capacitance, resistance or inductance that such a network was designed for. This performance disparity has appeared in the form of circuit system anomalies or failures over the last 2–3 years in circuitry between the higher operating frequency of microprocessors, clocks, power delivery bus lines, and memory systems, and that of the supporting passive elements, has resulted in system failures.

Additionally, at these higher frequencies, energy pathways should normally be grouped or paired as an electrically complementary element or elements that work together electrically and magnetically in harmony and in balance within an energized system. Attempts to line condition propagating energy with prior art componentry has led to increased levels of interference in the form of EMI, RFI, and capacitive and inductive parasitics. These increases are due in part to imbalances and performance deficiencies of the passive componentry that create or induce interference into the associated electrical circuitry. This has created a new industry focus on passive componentry whereas, only a few years ago, the focus was primarily on the interference created by the active components from sources and conditions such as voltage imbalances located on both sides of a common reference or ground path, spurious voltage transients from power surges, human beings, or other electromagnetic wave generators.

At higher operating speeds, EMI can also be generated from the electrical circuit pathway itself, which makes shielding from EMI desirable. Differential and common mode noise energy can be generated and will traverse along and around cables, circuit board tracks or traces, and along almost any high-speed transmission line or bus line pathway. In many cases, energy fields that radiate from these critical energy conductors act as an antenna, hence aggravating the problem even more. Other sources of EMI interference are generated from the active silicon components as they operate or switch. These problems such as SSO are notorious causes of circuit disruptions. Other problems include unshielded and parasitic energy that freely couples upon or onto the electrical circuitry and generates significant interference at high frequencies.

Other disruptions to a circuit derive from large voltage transients, as well as ground loop interference caused by varying ground potentials, which can render a delicately balanced computer or electrical system, useless. Existing surge and EMI protection devices have been unable to provide adequate protection in a single integrated package. Varieties of discrete and networked lump filters, decouplers, surge suppression devices, combinations, and circuit configurations have proven ineffectual as evidenced by the deficiency of the prior art.

U.S. patent application Ser. No. 09/561,283 filed on Apr. 28, 2000 and U.S. patent application Ser. No. 09/579,606 filed on May 26, 2000 by the applicants relate to continued improvements to a new family of discrete, multi-functional energy conditioners. These multi-functional energy conditioners posses a commonly shared, centrally located, conductive electrode of a structure that can simultaneously interact with energized and paired conductive pathway electrodes contained in energy-carrying conductive pathways. These energy-carrying conductive pathways can operate in an oppositely phased or charged manner with respect to each other and are separated from one another by a physical shielding. This application expands upon this concept and further discloses a new width and breadth of additional and unobvious embodiment variations of what the applicants believe to be a new universal system of circuit protection and conditioning that will help solve or reduce industry problems and obstacles with simplicity and exponential effectiveness. Variations of the invention can also use many commonly found and accepted materials and methodologies for its production. The applicants also believe this the invention and its variations to be a universally exploitable solution that is cost effective by today's economic standards and that it will have a longevity of usages, despite the ever-increasing operating frequencies of future circuits. The applicants also believe this the invention and its variations that can be created will minimize production and logistical discontinuities for any adopters of the technology. Variations of the invention use commonly found and accepted materials and methodologies for its production which in-turn can minimize production and logistical discontinuities for any adopters of the technology. Manufacturing infrastructure is provided with an unprecedented ease of adaptability or production changeover as compared to the prior art.

SUMMARY OF THE INVENTION

Based upon the foregoing, there has been found a need to provide a layered multi-functional, common conductive shield structure containing energy-conductive pathways that share a common and centrally positioned conductive pathway or electrode as part of its structure which allows for energy conditioning as well as a multitude of other functions simultaneously, within one inclusive embodiment or embodiment variation that possesses a commonly shared and centrally positioned conductive pathway or electrode as part of its structure. The layered, multi-functional, common conductive shield structure also provides simultaneous physical and electrical shielding to portions of propagating energy by allowing predetermined, simultaneous energy interactions to take place between grouped and energized conductive pathways and various conductive pathways external to the embodiment elements.

Existing prior art discrete decoupling capacitors lose their effectiveness at about 500 MHz. For example, mounting inductance for 0603 size capacitors has been reduced to approximately 300 pH. Assuming 200 pH for the internal capacitance of the capacitors, this equates to a total of 500 pH, which corresponds to 942 mOhms at 500 MHz. Accordingly, current discrete capacitors are not effective. While it is possible to use the series resonant frequency and low ESR capacitors to drive towards a low impedance at 500 MHz, the capacitance required to obtain 500 MHz with 500 pH ESL is about 200 pF. Current prior devices get 225 pF for every square inch of power planes which would require more than one discrete capacitor every square inch. A superior approach is to get the low impedance from the power planes. It is impractical to utilize many low impedance decoupling capacitors on a PCB if low impedance power planes are not available to them hook them up. Accordingly, the solution to low impedance power distribution above several hundred MHz lies in thin dielectric power plane technology, in accordance with the present invention, which is much more effective than discrete decoupling capacitors. Therefore, it is also an object of the invention to be able to operate effectively across a broad frequency range as compared to a single component or a multiple passive conditioning network. Ideally, this invention can be universal in its application potentials, and by utilizing various embodiments of predetermined grouped elements, a working invention will continue to perform effectively within a system operating beyond 1 GHz of frequency.

It is an object of the invention to be able to provide energy decoupling for active system loads while simultaneously maintaining a constant, apparent voltage potential for that same portion of active componentry and its circuitry.

It is an object of the invention to minimize or suppress unwanted electromagnetic emissions resulting from differential and common mode currents flowing within electronic pathways that come under the invention influence.

It is an object of the invention to provide a multi-functional, common conductive shield and energy conditioning structure for conductive energy pathways which can take on a wide variety of multi-layered embodiments and utilize a host of dielectric materials, unlimited by their specific physical properties that can, when attached into circuitry and energized, provide simultaneous line conditioning functions and protections as will be described.

It is an object of the invention to provide the ability to the user to solve problems or limitations not met with prior art devices which include, but are not limited to, simultaneous source to load and/or load to source decoupling, differential mode and common mode EMI filtering, containment and exclusion of energy parasitic containment and exclusion, as well as surge protection in one integrated embodiment and that performs these described abilities when utilizing a conductive area or pathway external to the originally manufactured embodiment.

It is an object of the invention to be easily adapted to utilization with one or more external conductive attachments to a conductive area located external to the originally manufactured invention which can aid the invention embodiments in providing protection to electronic system circuitry. Additionally, protection is offered from an in-service to active electronic components from electromagnetic field interference (EMI), over voltages, and debilitating electromagnetic emissions contributed from the invention itself, which in prior art devices would be contributed as parasitics back into the host circuitry.

It is an object of the invention to provide a physically integrated, shield-containment, conductive electrode architecture for the use with independent electrode materials and/or an independent dielectric material composition, that when manufactured, will not limit the invention to a specific form, shape, or size for the multitude of possible embodiments of the invention that can be created and is not limited to embodiments shown herein.

It is an object of the invention to provide a user with an embodiment that gives the user the ability to realize a comparatively inexpensive, miniaturized, solution that would be available for integration and incorporation into a plurality of electronic products. It is an object of the invention to provide an embodiment free of the need of using any additional discrete passive components to achieve the desired filtering and/or line conditioning that prior art components are unable to provide.

It is an object of the invention to provide an embodiment giving the user an ability to realize an easily manufactured, adaptable, multi-functional electronic embodiment for a homogenous solution to a wide portion of the electrical problems and constraints currently faced when using prior art devices.

It is another object of the invention to provide an embodiment in the form of discrete or non-discrete devices, or pre-determined groupings of conductive pathways, that form a multi-functioning electronic embodiment that when attached to an internal conductive pathway or a pre-determined conductive surface, operates effectively across a broad frequency range and simultaneously provides energy decoupling for active circuit componentry, while maintaining a constant apparent voltage potential for portions of circuitry.

It is another object of the invention to provide an embodiment in the form of discrete or non-discrete devices, or pre-determined groupings of conductive pathways, that form a multi-functioning electronic embodiment to provide a blocking circuit or circuits utilizing an inherent common conductive pathway inherent to the embodiment, which is combined with an external conductive surface or ground area to provide connection to an additional energy pathway from the paired conductive pathway conductors for attenuating EMI and over voltages.

It is another object of the invention to provide an embodiment that utilizes standard manufacturing processes and be constructed of commonly found dielectric and conductive or conductively made materials to reach tight capacitive tolerances between electrical pathways within the embodiment while simultaneously maintaining a constant and uninterrupted conductive pathway for energy propagating from a source to an energy utilizing load.

Lastly, it is an object of the invention to provide an embodiment that couples pairs of electrical conductors very closely in relation to one another into an area or space partially enveloped by a plurality of commonly joined conductive electrodes, plates, or pathways, and can provide a user with a choice of selectively coupling external conductors or pathways on to separate or common conductive pathways or electrode plates located within the same embodiment.

Numerous other arrangements and configurations are also disclosed which implement and build on the above objects and advantages of the invention in order to demonstrate the versatility and wide spread application of a universal, multi-functional, common conductive shield structure with conductive pathways for energy and EMI conditioning and protection, within the scope of the present invention.

BRIEF DESCRIPTION OF THE DRAWINGS

FIG. 1 shows a top view of a portion of a Faraday cage-like shield structure portion of the present invention;

FIG. 2 shows an exploded perspective view of a portion of the present invention comprising an interconnected, parallel, common conductive shield structure;

FIG. 2B shows an exploded perspective view of a portion of the present invention comprising an interconnected, parallel, common conductive shield structure as shown in FIG. 2 and a depiction of differential conductive pathways operating within the structure and the field motion as energy is undergoing conditioning within the structure.

FIG. 3A shows an exploded cross-section view of a layered by-pass arrangement of an embodiment of the present invention with outer image shields;

FIG. 3B shows a second exploded cross-sectional view of a layered by-pass as shown in FIG. 3A and rotated 90 degrees there from;

FIG. 4A shows an exploded, perspective view depicting four common conductive cage-like structure containers as shown in FIG. 2 for comparison to a non-discrete universal multi-functional common conductive shield structure with feed-thru pathways (UMFCCSS-F) shown in FIG. 4B; FIG. 4B shows an exploded view depicting four common conductive cage-like structure containers with conductive pathways that make up a universal multi-functional common conductive shield structure with feed-thru pathways (UMFCCSS-F);

FIG. 4C shows an exploded, perspective view depicting four common conductive cage-like structure containers shown in FIG. 2 for comparison to a non-discrete universal multi-functional common conductive shield structure with bypass pathways (UMFCCSS-B) shown in FIG. 4D FIG. 4D shows an exploded view depicting four common conductive cage-like structure with common conductive pathway electrode layers like that shown in FIG. 4C for use as a universal multi-functional common conductive shield structure with bypass pathways (UMFCCSS-B) when used in a non-discrete embodiment that can be manufactured into a PCB or substrate or a portion of a silicon die such as in a die made into a MPU, DSP or the like (micro processor unit or digital signal processor or any other silicon and/or copper based dice or die);

FIG. 5A represents a frozen moment in time taken of an exploded and inside-out view or depiction of a minimally configured 5-conductive pathway electrode layering within a UMFCCSS 3800 (in-bypass) placed into a simple circuit arrangement and energized with propagating energy.

FIG. 5B is a partial cross sectional view of the snap shot taken of the invention placed into an electrical system as shown in FIG. 5A;

FIG. 5C shows a data graph comparing same size and similar capacitive value embodiments of a universal multi-functional common conductive shield structure with bypass pathways (UMFCCSS-B) made in MOV dielectric and X7R dielectric and tested to 500 MhZ in a circuit system similar to that shown in FIG. 5A and FIG. 5B FIG. 5D is a data graph comparing various attachments and non-attachments of common conductive termination structures of a universal multi-functional common conductive shield structure with bypass pathways (UMFCCSS-B) and an external conductive surface common to all termination structures run out to 1,200 MhZ.

DETAILED DESCRIPTION OF THE PREFERRED EMBODIMENT

As used herein, the acronym terms "UMFCCSS" refers to all types both discrete and non-discrete versions of multi-functional common conductive shield structure with conductive pathways, "UMFCCSS-F" refers to both discrete and non-discrete versions of multi-functional common conductive shield structure with conductive feed-thru pathways. The term "UMFCCSS-B" refers to both discrete and non-discrete versions of multi-functional common conductive shield structure with conductive by-pass pathways for all disclosure purposes.

In addition, as used herein, the acronym term "AOC" for the words "predetermined area or space of physical convergence or junction" which is defined as the physical boundary of manufactured-together invention elements. Non-energization and energization are defined as the range or degree to which electrons within the "AOC" are in motion and are propagating to and/or from an area located outside the pre-determined boundary of an electrical conductive pathway or energized circuit pathway that contains either discrete or non-discrete versions of a UMFCCSS-AOC. Non-energization and energization are also defined as the range or degree to which propagated energy within the "AOC" reacts with invention elements and/or combinations of elements to conduct a phased or charged exchange of electrons in a balanced manner.

The invention begins as a combination of electrically conductive, electrically semi-conductive, and non-conductive dielectric independent materials, layered or stacked in various embodiments such as discrete and non-discrete structures. These layers can be combined to form a unique circuit when placed and energized in a system. The invention embodiments include layers of electrically conductive, electrically semi-conductive, and non-conductive planes that form groups of common conductive pathway electrodes, conductors, deposits, plates (all referred to as 'pathways', herein), and dielectric planes. These layers are oriented in a generally parallel relationship with respect to one another and to a predetermined pairing or groups of elements that also include various combinations of pathways and their layering into a predetermined structure that is universal in the type of embodiments that can be manufactured.

Other elements can include some means of conductively coupling the common conductive planes. These devices are not just limited to dielectric layers, multiple electrode conductive pathways, sheets, laminates, deposits, multiple common conductive pathways, shields, sheets, laminates, or deposits. The invention also includes element methods to combine these elements together in an interweaved arrangement of overlapping and non-over-lapping methodologies that also connects specific types of planes together for energization into a larger electrical system in a predetermined manner. This manner yields distinct electrical circuit functions, some heretofore not found, occurring both effectively and simultaneously, with multiple embodiments of prior art devices. When or after the structured layer arrangement is manufactured, the structured layer arrangement can be shaped, buried within, enveloped, or inserted into, various electrical systems or other sub-systems. The circuit of the structure can easily be combined with almost any larger circuitry to perform line conditioning, decoupling, and/or aid or modifying an electrical transmission of energy to a desired electrical form or electrical shape.

The invention can be a separate, stand-alone embodiment or manufactured as a group and integral to a larger electrical structure such as an integrated circuit. It can also exist as a non-energized stand alone discrete device that can be energized with a combination as a sub-circuit for larger circuitry found in other embodiments such as, but not limited to, a Printed Circuit Board (PCB), interposer, substrates, connectors, integrated circuits, or atomic structures.

An alternative invention embodiment can also by built primarily as another device such as, a PCB, interposer, or a substrate, that has a purpose mainly other than that of a smaller discrete version of the invention. This alternate type of embodiment serves as a possible system or subsystem platform that contains both active and passive components along with circuitry, yet is layered to provide most of the benefits described for conditioning propagated energy from a source to a load and back to a return.

PCBs are already utilizing predetermined layered configurations with VIAs to service or tap the various power, signal, and ground layers that lie between a dielectric and insulating material. The characteristics described herein can easily be obtained from such a device.

By surrounding the conductive pathway electrode planes with the Faraday cage-like structures made up with one centralized and shared, common conductive pathway or area, the one centralized and shared, common conductive pathway or plane becomes a 0-reference ground plane for circuit voltages located between the two oppositely phased or potential conductive structures and located on opposite sides of the central, shared, common conductive layer.

This configuration aids significantly in eliminating and suppressing E-Fields and H-fields, stray capacitances, stray inductances, parasitics, and allowing for mutual cancellation of oppositely charged or phased, adjoining or abutting, electrical fields of the variously positioned signal, power and return pathways. An external conductive connection for a PCB built with the device can take advantage of the various grounding schemes used now by large PCB manufacturers.

To propagate electromagnetic interference energy, two fields are required, an electric field and a magnetic field.

Electric fields couple energy into circuits through the voltage differential between two or more points. Changing electrical fields in a space give rise to a magnetic field. Any time-varying magnetic flux will give rise to an electric field. As a result, a purely electric or purely magnetic time-varying field cannot exist independent of each other.

A passive architecture, such as utilized by the invention, can be built to condition or minimize both types of energy fields that can be found in an electrical system. While the invention is not necessarily built to condition one type of field more than another, however, it is contemplated that different types of materials can be added or used to build an embodiment that could do such specific conditioning upon one energy field over another.

Today's higher operating frequencies of circuitry, for the most part, require the user to develop combinations of single or multiple passive elements such as inductors, capacitors, or resistors to create L-C-R, L-C, and R-C discrete component networks used to control energy delivered to a system load. However, prior art, discrete, L-C-R, L-C, R-C component networks at frequencies above 200 MhZ, begin to take on characteristics of transmission lines, or can even exhibit microwave-like features at still higher frequencies.

Use of prior art components within these situations can allow unsuppressed or undiminished parasitics from the conductive pathways located internal to prior art devices or radiating from the connection structures that combine externally between all of the discrete elements into the prior art network, to degrade, slow down, or otherwise contribute noticeable degradation of the energy propagating along the circuit over a wide range of frequency operations. This can be substantially harmful to the larger circuit the prior art network is attached to, as well.

Rather than providing a lump capacitance, resistance, or inductance that such a prior art network was designed for at higher frequencies, these capacitive parasitics that are attributed to the internal electrodes located inside prior art component networks can be the sources of energy degradation, voltage and capacitive imbalance between differentially paired lines causing debilitation or sub-specified performance to the circuit as a whole. The sub-specified performance and energy losses such as attributed to data drop, line delays, etc. and can contribute to measurable circuit inefficiency.

As for all embodiments of the present invention depicted and those not pictured, the applicant contemplates a manufacturer to have the option in some cases for combining a variety and wide range of possible materials that are selected and combined into the material make-up of the invention when manufactured, while still maintaining some or all of the desired degree of electrical functions of the invention.

Thus, materials for composition of the invention can comprise one or more layers of material elements compatible with available processing technology and is not limited to any possible dielectric material. These materials may be a semiconductor material such as silicon, germanium, gallium-arsenide, or a semi-insulating or insulating material and the like such as, but not limited to any K, high K and low K dielectrics.

Equally so, the invention is not limited to any possible conductive material, magnetic, nickel-based materials, MOV-type material, ferrite material, films such as Mylar, any substances and/or processes that can create conductive pathways from a conductive material, and any substances and/or processes that can create conductive areas such as, but not limited to, doped polysilicons, sintered polycrystallines, metals, or polysilicon silicates, polysilicon silicide.

The invention removes an obstacle called capacitive load balancing between energized paired or multiple lines much differently than that of two discrete capacitors placed in a circuit and connected to a return path, which is also known as bypass decoupling.

Prior art capacitors manufactured in the same production batch which can easily posses a variability in capacitance, ranging anywhere from 15%–25%. Thus, when prior art capacitors are placed into a circuit and energized, the manufacturing tolerances are carried to the circuit, and in one case, such as with a differential paired circuit, these capacitive imbalances are multiplied and cause a voltage imbalance in the circuit. Even while it is possible to obtain individual variations of capacitance between prior art discrete units of less than 10%, it is however, at a cost or a substantial premium that must be paid by the user over the common dielectrics in order for the manufacturer to recover the costs for testing, hand sorting manufactured lots, as well as the additional costs for the more specialized dielectrics and manufacturing techniques that are needed to produce these prior art devices with reduced individual variance differences required for differential signaling.

The invention allows the use of very inexpensive dielectric materials (relative to the others available) to be used to obtain capacitive balance between two differential lines. Industry manufacturing standards are such that a precise amount of dielectric and conductive plate materials can be laid or made for use in a standard passive component such as a capacitor. This manufacturing process has excellent control structures to insure a variance of from 1% to 5% between discrete units of the same batch.

Use of the invention will allow a placement into a differentially operated circuit or any paired line circuitry that will provide balanced and essentially equal capacitive tolerances of one invention unit that is shared and between each of a paired line, equally, in an electrical manner.

Invention tolerances or capacitive balance between a commonly shared central conductive pathway found internally within the invention can be maintained at levels that originated at the factory during manufacturing, even with the use of x7r dielectric, which is widely and commonly specified with as much as 20% or allowable capacitive variation among prior art discrete units of the same manufacturing run.

Use of one invention unit between energized paired lines rather than use of prior art units will alleviate the electronic industry problem of capacitive difference introduce between a paired line, particularly at sensitive high frequency operation.

When the universal multi-functional common conductive shield structure is manufactured and subsequently attached to an externally manufactured conductive pathway (not of), but separate from, the differential pathways that are also utilizing the invention embodiment, the device will simultaneous provide energy conditioning functions that include bypassing, energy, power line decoupling, energy storage such that the differential electrodes that are enveloped within the shield structure and that are free from almost all internally generated capacitive or energy parasitics trying to escape from the enveloped containment area surrounding the conductive pathway electrode, and at the same time, the universal multi-functional common conductive shield structure that is attached to an externally manufactured conductive pathway (not of), but separate from, the differential pathways will act to prevent any externally generated capacitive or energy parasitics such as "floating capacitance" from coupling onto the very same differential conductive pathways due to the physical shielding, separate of the electrostatic shield effect created by the energization of the common conductive structure and its attachment with common means know to the art to an externally located conductive area.

Thus, these parasitics of all types are prevented or minimized from upsetting the capacitive balance that was manufactured into the unenergized invention and is contrary to what occurs with every other prior art unit not using the conductive shield structure. Prior art has always allowed effects from free parasitics in both directions to disrupt a circuit despite the best attempts to the contrary with all prior art devices to date.

Thus, a device that is manufactured at 1% tolerance, when manufactured as described in the disclosure, will also have a correlated 1% capacitive tolerance between paired lines in an energized system. As an added benefit exchange, two prior art devices used for by-passing paired lines are replaced with one invention embodiment.

The new device is placed between paired or a paired plurality of differential conductive pathways, while the common conductive pathways that also make up the invention are connected to a third conductive pathway that is common to all elements of the common conductive pathways and is the external conductive area.

Thus, expensive, non-commonly used, specialized, dielectric materials are no longer needed for delicate bypass and/or decoupling operations in an attempt to maintain a capacitive balance between two system conductive pathways, as well as giving an invention users the opportunity to use a capacitive element that is homogeneous in material make up within the entire circuit.

(Attachment to an external conductive area includes areas such as commonly described as a "floating", non-potential conductive area, a circuit system return, chassis or PCB ground, or even an earth ground.)

The invention, through other functions such as cancellation of mutually opposing conductors, allows a low impedance pathway to develop within the Gauss-Faraday cage-like units with respect to the enveloping conductive common shields pathways that can subsequently continue to move energy out onto the externally located conductive area, and thus complete an energy pathway of low impedance for unwanted EMI noise as well.

This type of attachment scheme normally will allow a "0" voltage reference to develop with respect to each differential conductor located on opposite sides of the shared central and common conductive pathway, its termination structures, if any and the externally used conductive surface.

Thus, in situations such the need in high frequency applications to maintain a voltage balance between a source and an energy utilizing load, the invention is an ideal and universal solution.

Thus the voltage is maintained and balanced even with SSO (Simultaneous Switching Operations) states among gates located within an integrated circuit and without contributing disruptive energy parasitics back into the circuit system as the invention is passively operated, within.

Discrete passive components employ surface mount technology to physically and electrically connect to external electrical conductors and traces or pathways found on/in, but not limited to, printed circuit boards (PCB), multi-silicon chip module (MCM), silicon chip scale packages (CSP), interposer, substrates, connectors, integrated circuits. The present invention may exist in innumerable embodiments. These are an example of various types of layered configurations contemplated, but are not intended to limit the invention and the various additional embodiments of multi-component filters will be described.

In each figure, the five pathways are shown individually and then in a top plan view and finally in a side view. Another variation of the invention relates to improvements to multi-layered electronic circuit conditioning assemblies that consists of a physical layering architecture that suppresses unwanted electromagnetic emissions, both those unwanted electromagnetic emissions received from other sources and those created internally within the multi layered electronic circuit conditioning assemblies' internal electronic circuitry such as differential and common mode currents.

In addition, due to the inventions' physical architecture, a variety of materials can make up the inventions' composition, over voltage surge protection and magnetic properties can be integrally incorporated with many versions or variations of the multi layered electronic circuit conditioning assemblies including, but not limited to decoupling, by-passing to ground, differential and common mode filtering functions and the like.

As previously, noted, propagated electromagnetic interference can be the product of both electric and magnetic fields, respectively. Until recently, emphasis in the art has been placed upon on filtering EMI from circuit or energy conductors carrying high frequency noise with DC energy or current. However, the invention is capable of conditioning energy that uses DC, AC, and AC/DC hybrid-type propagation of energy along conductive pathways found in an electrical system or test equipment. This includes use of the invention to condition energy in systems that contain many different types of energy propagation formats found in systems containing many kinds of circuitry propagation characteristics within the same electrical system platform. The main cause of radiated emission problems can be due to the two types of conducted currents, differential and common mode energy. The fields generated by these currents result in many types of EMI emissions. Differential mode (DM) currents are those currents that flow in a circular path in wires, circuit board traces, and other conductors. The fields related to these currents originate from the loop defined by the conductors. Without limiting the invention in any way, an example of an assembly in accordance with the invention is provided below.

Principals of a Faraday cage-like structure are used when the common plates are joined to one another and the grouping of common conductive pathways together coat with the larger external conductive area or surface to suppress radiated electromagnetic emissions and provide a greater conductive surface area in which to dissipate over voltages and surges and initiate Faraday cage-like electrostatic suppression of parasitics and other transients, simultaneously. This is particularly true when a plurality of common conductive pathways are electrically coupled to system, chassis ground and is relied upon for reference ground for a circuit in which the invention is placed into and energized. As mentioned earlier, one or more of a plurality of materials having different electrical characteristics can be inserted and maintained between common conductive pathways and both electrode pathways. Differential layered termination structures are always separated electrically from one another in the circuit and do not touch within the device. They are always separated physically from one another by an interposing pair of common pathway(s) or a single pathway and dielectric material. The Faraday cage-like structure or configuration concept of the present invention is shown in detail. According to the present invention, FIG. 1 comprises a portion of the Faraday cage-like structure 800 that consists of two areas of space that sandwiches one of two differential electrodes. Conductive electrode pathway 809 is sandwiched between central common conductive shared pathway 804 and common conductive pathway 808 (not shown). Common conductive pathways 804, 808 (not shown) and 810 (not shown) are all separated from each other by a general parallel interposition of a predetermined dielectric material and between each outside pathway 810 and 808 relative to each pathways respective position to the central common conductive shared pathway 804, by differential conductive electrode pathways 809 and 809' (not shown) that feature a differential conductive electrode such as conductive pathway 809 almost completely covered or shielded by pathways 808 and 804, respectively that are sandwiching pathway 809, in this case, above and below, within the invention. The pathways 804, 808, and 810 are also surrounded by dielectric material 801 that provides support and an outer casing of the component. A means to allow connection of both common shield termination structures 802 to the same common conductive pathways 808 and 804 and 810 individually is desired. When the entire invention is placed into circuitry, termination structures 802 should be attached by standard means known in the art to the same external conductive area or to the same external conductive path (not shown) without an interruption or conductive gap between each respective termination structure. A standard means known in the art facilitates connection of common shield termination structures 802 that attached respectively on all three pathways 804, 808, and 810 together will form a single structure 800 to act as one common conductive cage-like structure of 800. Although not shown, 800' mirrors single Faraday cage-like structure 800 except that differential electrode 809' contained within has a exit/entrance section 812A (not shown) that is not fully shielded, but in a generally opposing direction of 180 degrees to that of conductive termination structure 809' and differential electrode 809 to join with conductive termination structure 809A' (not shown). These two Faraday cage-like structures 800 and 800' are in a positioned and parallel relationship, but most importantly structures 800 and 800' are sharing the same, central common conductive shared pathway 804, layer or pathway that makes up each Faraday cage-like structure 800 and 800' when taken individually. Together 800 and 800' create a single and larger conductive Faraday cage-like shield structure 800" (not shown) that acts as a double container. Each container 800 and 800' will hold an equal number of same sized differential electrodes that are opposing one another within said larger structure 800" in a generally parallel manner, respectively. Larger conductive Faraday cage-like shield structure 800" with coacting 800 and 800' individual shield-like structures when energized and attached to the same external common conductive path become one electrically. At energization, the predetermined arrangement of the common conductive electrodes into a differential conductive sandwich with a centralized common shield are elements that make up one common conductive cage-like structure 800" which is the base element of the present invention, namely the Faraday cage-like structure 800". The structure in essence, forms minimum of two Faraday cages 800 and 800' that are required to make up a multi-functional line-conditioning device in all of the layered embodiments of the present invention. The central common conductive shared pathway 804 with respect to its interposition between the differential electrodes needs the outer two additional sandwiching common electrode pathways 808 and 810 to be considered an un-energized Faraday cage-like structure 800". To go further, the central common pathway 804 will be simultaneously used by both differential electrodes 809 and 809' at the same time, but with opposite results with respective to charge switching. It must be noted that for most chip, non-hole thru embodiments, a new device will have a minimum of two electrodes sandwiched between three common conductive electrodes and connected external termination structures that are connected such that they are conductively as one to form a single, larger Faraday-cage-like structure 800", that when attached to a larger external conductive area, helps perform simultaneously energized line conditioning and filtering functions upon the energy propagating along the conductors and sandwiched within the cage-like structure 800" in an oppositely phased or charged manner. The now attached internal common conductive electrode pathways that make up the Faraday cage-like structure and subsequent energization, will allow the external conductive area or pathway to become, in essence, an extended, closely positioned, and essentially parallel arrangement of conductive elements with respect to its position also located internally within the pre-determined layered PCB or similar electronic circuitry. Connection of the joined common conductive and enveloping multiple common shield pathways with a common centrally located common conductive pathway 804 that will be to external extension elements will be interposed in such a multiple parallel manner that said elements will have microns of distance separation or 'loop area' with respect to the complimentary, phased differential electrodes that are sandwiched themselves and yet are separated from the extension by a resistance containing a dielectric medium. This enables the extension to become an enveloping shield-like element that will perform electrostatic shielding functions, among others, that the energized combination will enhance and produce efficient, simultaneous conditioning upon the energy propagating on or along said portions of assembly differential conductors. The internal and external parallel arrangement groupings of a combined common conductive planes or areas will also cancel and/or suppress unwanted parasitics and electromagnetic emissions that can escape from or enter upon portions of said differential conductors used by said portions of energy as it propagates along a conductive pathway to active assembly load(s). In the following sections, reference to common conductive pathway 804 also applies to common conductive pathway 808 and 810. Common conductive pathway 804 is offset a distance 814 from the edge of the invention. One or more portions 811 of the common ground common conductive pathway 804 extends through material 801 and is attached to common ground termination band or structure 802. Although not shown, the common ground termination band 802 electrically connects the common conductive pathways 804, 808 and 810 to each other, and to all other common conductive pathways of the filter, if used.

The conductive electrode pathway 809 is not as large as the common conductive pathway 804 such that an offset distance and area 806 exists between the edge 803 of the electrode pathway 809 and of the edge 805 of the central common conductive shared pathway 804. This offset distance and area 806 enables the common conductive pathway 804 to extend beyond the electrode pathway 809 to provide a shield against any flux lines which might extend beyond the edge 803 of the electrode pathway 809 resulting in reduction or elimination of near field coupling to other electrode pathways within the filter or to elements external to the filter. The horizontal offset is approximately 0 to 20+times the vertical distance between the electrode pathway 809 and the common conductive' pathway 804, however, the offset distance 806 can be optimized for a particular application but all distances of overlap 806 among each respective pathway is ideally approximately the same as manufacturing tolerances will allow. Minor size differences are unimportant in distance/area 806 between pathways as long as the electrostatic shielding function of structure 800" is not compromised. In order to connect electrode 809 to the energy pathways (not shown), the electrode 809 may have one or two portions 812 which extend beyond the edge 805 of the common conductive pathway 804 and 808. These portions 812 are connected to electrode termination band 807 which enables the electrode 809 to be electrically connected to the energy pathways (not shown) by solder or the like. It should be noted that element 813 is a dynamic representation of the center axis point of the three-dimensional energy conditioning functions that take place within the invention and is relative with respect to the final size, shape and position of the embodiment in an energized circuit.

Referring now to FIG. 2, the concept of the universal, multi-functional, common conductive shield structure (UMFCCSS) is shown. The UMFCCSS shown comprises multiple, stacked, common conductive cage-like structures 800A, 800B, 800C, and 800D (each referred to generally as 800X), in a generally parallel relationship. Each common conductive cage like structure 800X comprises at least two common conductive pathway electrodes 830, 810, 804, 808, 840. The number of stacked, common conductive cage-like structures 800X is not limited to the number shown herein, and can be any even integer. Although not shown, in applications, each common conductive cage-like structure sandwiches a conductive pathway electrode as previously described in relation to FIG. 1. The common conductive cage-like structure 800X are shown separately to emphasize the fact that any type of conductive pathway electrode can be inserted within the common conductive cage like structures 800X. As such, the common conductive cage-like structures 800X have a universal application and can be used in combination with conductive pathway electrodes in discrete, or non-discrete configurations such as, but not limited to, embedded within silicone or as part of a PCB. The common conductive pathway electrodes 830, 810, 804, 808, 840, have terminations which are all conductively interconnected as shown at 802 which provide a connection point to an external conductive area. Each common conductive pathway electrode 830, 810, 804, 808, 840, is formed on a plate of dielectric material 801 and insulated on opposite sides by insulation band 805 which is also comprised of dielectric material 801. As has described in FIG. 1, the dielectric material 801, conductively separates the individual common conductive pathway electrodes from the conductive pathway electrodes (not shown) sandwiched therein. Also as described in relation to FIG. 1, a minimum of two Faraday cages 800 and 800' are required to make up a multi-functional line-conditioning device in all of the layered embodiments of the present invention Accordingly, there are a minimum of two required common conductive cage like structures 800X, as represented in FIG. 2 by 900 A, 900 B, and 900C. The area of convergence (AOC) is designated at 813 and will be discussed in detail below.

Referring now to FIG. 2B, the universal, multi-functional, common conductive shield structure (UFMCCSS) is shown combined with differential conductive energy pathways 4880 C, 4890 C operating within the structure, to form a universal, multi-functional, common conductive shield structure bypass UFMCCSS-B configuration, attached and energized, within a larger external circuitry system (not shown) by solder, or the like, as generally designated at 6805. The field motion as energy is undergoing conditioning within the structure is depicted between differential conductive energy pathways 4880C, 4890C, and each surrounding common conductive cage like structure 800A, 800B, 800C, 800D.

The energy propagating along the differential conductive energy pathways 4880C and 4890C are propagating in opposite directions in relation to each other. Propagation of energy creates inductive coupling in the form of magnetic field fields, shown generally by element 875, which rotate in a counter-clockwise in relation to the energy propagation direction. The opposing direction of energy propagation in differential conductive energy pathways 4880C and 4890C result in magnetic fields 875 created by the currents rotating in opposite directions providing a mutual flux cancellation, or minimization, of the magnetic fields.

While the common conductive cage-like structures structures 800A, 800B, 800C, 800D sandwich the differential conductive energy pathways 4880C, 4890C, the shared, common conductive pathways shared between the structures 800A, 800B, 800C, 800D, provide a voltage balance to the attached circuit. It is noted that the upper and lower most differential conductive energy pathway does not have a corresponding differential conductive energy pathway on the side opposite the area of convergence. The conductively attached common conductive cage-like structures 800A, 800B, 800C, 800D, in combination with common conductive terminations structure 802, sandwich and almost completely envelope differential conductive energy pathways 4880C, 4890C. Specifically, the conductively connected cage like structures provide a double development in conjunction with common conductive terminations structure 802 which helps improve the voltage balance as well as containment of parasitics.

Referring now to FIGS. 3A and 3B, a further embodiment of the layered, universal, multi-functional common conductive shield structure of the present invention is shown in a by-pass configuration 6800, hereinafter referred to as "by-pass shield structure." By-pass shield structure 6800 could also take on a configuration of "feed-thru shield structure" 6800 in terms of relative stacking position of a static embodiment of each. There would be relatively no difference between these two possible configurations when inspecting the positioning of stacked two common conductive shield structures 1000A and 1C00B or of common conductive pathways 6808, 6804, 6810, 6811, 6812 and central common shared conductive pathway 6804 that could make up each embodiment. While appearing physically similar in arrangement "feed-thru shield structure" 6800 and "by-pass shield structure" 6800, each would still yield the same possible functional contribution to the energy conditioning of a circuit. However, the way to which the non-common pathways 6809 and 6805 are positioned would determine the finale type of energy conditioning results that could be expected. Whatever configuration, the various shielding functions, physical and electrically would approximately work the same way with respect to propagated energy in the AOC of 6800 Feed-thru or By-pass. Referring specifically to FIG. 3A, the by-pass shield structure 6800 is shown in cross section extending longitudinally and comprises a seven layer common conductive pathway stacking of two common conductive shield structures, which form the present embodiment of the by-pass shield structure. In FIG. 3B, the by-pass shield structure 6800 is shown in cross section perpendicular to the cross section shown in FIG. 3A.

Referring to both FIGS. 3A and 3B, the by-pass shield structure 6800 comprises a central common conductive shared pathway 6804 that is connected with elements and energized and will form a zero voltage reference to circuitry (not shown) with the creation of 6804-IM, 6811-IM and 6812-IM which is formed and relative only to the active circuit elements attached commonly (not shown) but not before connection of the 6802 (s) by connection means 6805 to external conductive surface 6803. After energization the energized circuit (not shown) created active energy-utilizing load or loads will utilize portions of propagated energy with elements, central common conductive shared pathway 6804, 6808, 6810, 6811, 6812 which are all attached to external common conductive electrode structure(s) 6802 which in turn are both coupled to external common conductive pathway 6803 by attachment means 6805 such as solder material or any other attachment means commonly found in the art. With energization, the circuitry will include a passively operating universal, multi-functional, common conductive shield structure that will be used by energy source and energy-utilizing load (s) with propagated energy in a balanced manner that will be available when energized active components in said circuitry (not shown) demand portions of said energy. Elements as just described including portions and of the common conductive elements in the chain of connections to 6803 as just described will be have created for said energized circuit elements, a zero voltage reference 6811-IM, 6804-IM, 6812-IM respectively, and with central common conductive shared pathway 6804 electrically balance coupled energy within the circuit with the formation of a third but common electrical node, separate of the two distinct and separate differential nodes utilized by differential conductive pathways 6809 and 6807 and their respective conductively linking elements.

In order to couple by-pass shield structure 6800 to an energized circuit, differential conductive pathways 6807 and 6809, respectively, are each inserted into one of the two common conductive shield structures. The first common conductive shield structure is formed between common conductive pathway 6810 and central common conductive-shared pathway 6804. The second common conductive shield structure is formed between common conductive pathway 6808 and central common conductive shared pathway 6804. To use by-pass shield structure 6800 a first differential conductive pathway 6807 is placed within the first common conductive shield structure and separated from the common conductive pathway 6810 and the central common conductive-shared pathway 6804 by a dielectric material 6801. The dielectric material 6801 separates and electrically isolates the first differential conductive pathway 6807 from the first common conductive shield structure. In addition, a second differential conductive pathway 6809 is placed within the second common conductive shield structure and separated from the common conductive pathway 6808 and the central common conductive-shared pathway 6804 by a dielectric material 6801.

The first and second differential conductive pathways 6807 and 6809, respectively, are then electrically connected to external conductive energy pathways 6820 and 6821, respectively. The electrical connections can be made by any means known to a person of ordinary skill in the art, including but not limited to solder, resistive fit sockets, and conductive adhesives. Completing the by-pass shield structure 6800 are the additional outer shield structures 6811 and 6812, which sandwich both common conductive shield structures with dielectric material 6801 interposed between. Each of the outer common conductive shields form image structures 6808-IM and 6810-IM as just described, when energized, that includes an outer conductive portion of shields 6811 and 6812 (not shown) and the outer conductive portions of external common conductive electrode structure (s) 6802 that forms a relatively large skin area and a zero voltage reference with 6804-IM by external common conductive electrode structure 6802. The outer skin surface formed by the combination of the external common conductive electrode structure 6802 and the outer shield image structures 6811 and 6812 absorbs energy when the circuit is energized and than act as an additional enveloping shield structure with respect to 6809 and 6807 differential conductive pathways. If the by-pass shield structure 6800 is attached to an external common conductive pathway 6803 of an energy conditioning circuit assembly ("ECCA") by known means, such as solder material 6805, portions of energy will travel along the created low impedance pathway that exists internally with common conductive structure elements and the external connection to third conductive pathway 6803 and be able to return by this pathway to its source.

The external common conductive electrode structure(s) 6802 are connected to electrical circuits by means known in the art and therefore the present invention is not limited to discreet structures but could, for example, be formed in silicon within an integrated circuit. In operation, by-pass shield structure 6800 and the two common conductive shield structures (referred elsewhere in the application as contained structures 800C and 800D, effectively enlarge the zero voltage reference 6804-IM, 6811-IM and 6812-IM within the area of convergence ("AOC") 6813. The AOC 6813 is the energy central balance point of the circuit. No matter the amount of shield layers used, the very basic common conductive pathway manufacturing sequence (excluding dielectric materials, etc.) is as follows, always, first a common conductive pathway, then a conductive pathway, then a second common conductive pathway, second conductive pathway and a third common conductive pathway. Additional sequence would than be as follows, third conductive pathway, fourth common conductive pathway, fourth conductive pathway; fifth common conductive pathway. If a shield configuration is desired to be used like 6800 by-pass or feed through, no difference, last sandwiching common conductive pathways 6811 and 6812 are placed in the manufacturing sequence as follows: (excluding dielectric material, etc.) 6812, common conductive pathway, than conductive pathway, than common conductive pathway, than second conductive pathway, then common conductive pathway, than third conductive pathway, than common conductive pathway, than fourth conductive pathway, than common conductive pathway and finally 6811.

The result of the by-pass shield structure when energized within a circuit is increased physical shielding from externally generated and internally propagating parasitics 6816 (represented by the double sided arrows) as well as providing lower impedance paths generated along the common conductive pathway electrode surfaces to external conductive pathway 6803. The double-sided arrows depict the electrostatic functions that occur in an energized state to energy parasitics 6816, which are also representative of portions of externally and internally originating energy parasitics that would otherwise disrupt portion of propagated energy. The double-sided arrows show the charged electron exchange representative of the electrostatic functions that occur in an energized state to trap parasitics within a shielded container. The double-sided arrows also represent the simultaneous, but opposite charge affect that occurs along the "skins" of the conductive material that is located within each respective container.

Referring now to FIGS. 4A and 4B, a universal multi-functional, common conductive shield structure with feed-thru pathways (UMFCCSS-F) is described. FIG. 4A shows the universal, multi-functional, common conductive shield structure having four stacked, common conductive cage-like structure containers 800A, 800B, 800C, and 800D (each referred to generally as 800X), in a generally parallel relationship, as previously shown in FIG. 2. Each common conductive cage like structure 800X comprises at least two common conductive pathway electrodes 4830, 4810, 4804, 4808, 4840. The common conductive pathway electrodes 4830, 4810, 4804, 4808, 4840, each have terminations which are all conductively interconnected as shown at 802 which provides a connection point to an external conductive area (not shown). Turning to FIG. 4B, four stacked, common conductive cage-like structure containers 800A, 800B, 800C, and 800D each contain a conductive pathway electrode 4809A, 4807A, 4809B, and 4807B, respectively. The conductive pathway electrodes 4809A, 4809B are conductively connected in parallel by termination bands 4880A and 4880B through the universal, multi-functional, common conductive shield structure in a feed-thru relationship. Termination bands 4880A and 4880B are conductively connected to power energy pathways from an energy power source (not shown). Termination bands 4890A and 4890 B. are conductively connected to return energy pathways from to an energy-utilizing load. It can be seen from FIG. 4B that the power conductive pathway electrodes 4809A and 4809B are interspersed with return conductive pathway electrodes 4807A and 4807B. Relating back to FIG. 4A, it can be seen that the shared common conductive pathway electrodes 4810, 4804, 4808 between common conductive cage like structure containers 800A, 800B, 800C, and 800 D, are each sandwiched in FIG. 4B between a power conductive pathway electrode and a return conductive pathway electrode. This enables the universal, multi-functional, common conductive shield structure to operate in a balanced manner as will be described in detail in relation to FIG. 5B. It is also pointed out that the central common conductive shared pathway electrode 4804 is centrally positioned having one power conductive pathway electrode and one return conductive pathway electrode on each side. Therefore central common conductive shared pathway electrode 4804 not only provides a balance between adjacent conductive pathway electrodes 4807A, 4809B, but also between call conductive pathway electrodes as the center of the area of convergence 813.

Referring now to FIGS. 4C and 4D, a universal, multi-functional, common conductive shield structure with feed-thru pathways (UMFCCSS-F) is described. FIG. 4C again shows the universal, multi-functional, common conductive shield structure having four stacked, common conductive cage-like structure containers 800A, 800B, 800C, and 800D (each referred to generally as 800X), in a generally parallel relationship, as previously shown in FIG. 2. Each common conductive cage like structure 800X comprises at least two common conductive pathway electrodes 4830, 4810, 4804, 4808, 4840. The common conductive pathway electrodes 4830, 4810, 4804, 4808, 4840, each have terminations which are all conductively interconnected as shown at 802 which provides a connection point to an external conductive area (not shown). Turning to FIG. 4D, four stacked, common conductive cage-like structure containers 800A, 800B, 800C, and 800D each contain a conductive pathway electrode 4809C, 4807C, 4809D, and 4807D, respectively. The conductive pathway electrodes 4809C, 4809D are conductively connected in parallel by termination band 4880C through the universal, multi-functional, common conductive shield structure in a by-pass relationship. Termination band 4880C is conductively connected to a power energy pathway from an energy power source (not shown). Termination band 4890C is conductively connected to a return energy pathway from to an energy-utilizing load (not shown). It can be seen from FIG. 4D that the power conductive pathway electrodes 4809C and 4809D are interspersed with return conductive pathway electrodes 4807C and 4807D. Relating back to FIG. 4C, it can be seen that the shared common conductive pathway electrodes 4810, 4804, 4808 between common conductive cage like structure containers 800A, 800B, 800C, and 800D, are each sandwiched in FIG. 4D between a power conductive pathway electrode and a return conductive pathway electrode. This enables the universal, multi-functional, common conductive shield structure to operate in a balanced manner as will be described in detail in relation to FIG. 5B. Again, it is also pointed out that the central common conductive shared pathway electrode 4804 is centrally positioned having one power conductive pathway electrode and one return conductive pathway electrode on each side. Therefore, central common conductive shared pathway electrode 4804 not only provides a balance between adjacent conductive pathway electrodes 4807C, 4809D, but also between call conductive pathway electrodes as the center of the area of convergence 813.

Turning to FIG. 5A & FIG. 5B which are almost identical depictions of UMFCCSS 3800-BY-PASS, and both will be described freely, back and fourth to explain and reveal a simple circuit using the invention and how portions of energy propagates within the circuit depicted interms of the other invention elements that will be listed. FIG. 5A is more of UMFCCSS 3800-BY-PASS a system view, while FIG. 5B is a close-up of the system energy propagation effects and structural representations of UMFCCSS 3800-BY-PASS as portions of energy is undergoing conditioning within the AOC of the invention embodiment. FIG. 5B depicts or represents a moment in time or snap-shot of an exploded and inside-out view or depiction of a minimally configured 5-conductive pathway electrode layering within a UMFCCSS 3800 (in-By-Pass) placed into a simple circuit arrangement and energized with propagating energy EEE-portions of propagating Energy; elements include 000 the circuit system 00—energy source for the system and EEE for the energy-utilizing load 01—energy-utilizing load of the system. The UMFCCSS-Bypass 3800 embodiment of the invention and a depiction of a snapshot of line conditioning functions for portions of energy propagation EEE that is underway within system 000. Dielectric material 3801 generally supports and insulates the conductive layers from each other as previously described in other embodiments. The electrostatic charge switching exchange 3802 or or a portion of the E-Field suppression of parasitic energies from 3818 and 3804 conductor cancellation of energy of UMFCCSS-B is also shown. Conductive pathway material 3803 forms attachment means differential conductive pathway or electrode 3804. Element 3805 (Not Shown) but is conductive mounting pad surface (needed) or area or means for portions of energy propagated along differential conductive attachment between 3818 to 3815 VIA 3809, if needed to 3820 from load 00 and to source 01 and from 3804 to 3803 to 3809 to 3811 from source 01 to load 00 and to 3818 thru 3809 (Not Shown).

Element 3806 represents common conductive pathway or electrode while element 3808 is the external common conductive pathway or area for portion of propagated energy to move to after passing into the AOC and utilizing common conductive pathway elements (as described) when portions of energy propagate to source 00, if able and will also work as a low impedance area or said energy EEE to return to source 00, if able.

Element 3809 Represents a Conductive VIA

3811 external differential conductive pathway

3813 AOC

3815 conductive pathway material for attachment means for external differential conductive pathway 3818 and external differential conductive pathway 3804

3816 Central common conductive shared pathway or electrode

3817 Central commonly shared "0" Voltage reference plane

3818 differential conductive pathway or electrode

3819 common conductive pathway or electrode

3820 external differential conductive pathway

3821A is a conductive material means for the connection of all the common conductive pathways 3806,3816, 3819 and commonly shared "0" Voltage reference plane 3817

3821B is also a conductive material means like 3821A for the connection to the same group of common conductive pathways 3806, 3816, 3819 and commonly shared "0" Voltage reference plane 3817

3824 Mutual Inductive Cancellation Portion for H-Field cancellation of energy of UMFCCSS-B shown The UMFCCSS-3800-BY-PASS is described as a minimum unit in which a capacitance is formed by the pair of the inner conductive pathway electrodes 3818 and 3804 separated by a respective dielectric layer or material 3801 and by central shared common conductive shield pathway electrode 3816. The described grouping as a whole is now further described as being sandwiched or almost enveloped by outer common conductive pathway electrodes 3806 and 3819. This is the total minimum Universal multi-functional common conductive shield structure with by-pass pathways sandwich of layers always includes, which is a plurality of dielectric layers or material 3801 always located or adjacent to some degree against almost all sides of all of the respective principle energy (NOT SHOWN) propagating surfaces of conductive pathway electrode elements, which are as follows:

EEE—portions of propagating Energy (not shown)

000 System

00—energy source for the system and the energy-utilizing load 01-energy-utilizing load of the system

3801 Dielectric material

3802 Electrostatic charge switching exchange or or a portion of the E-Field suppression of parasitic energies from 3818 and 3804 conductor cancellation of energy of UMFCCSS-B shown in FIG. 5A

3803 conductive pathway material for attachment means

3804 differential conductive pathway or electrode

3805 is conductive mounting pad surface (as needed) or area or means for portions of energy propagated and by differential conductive attachment between 3818 to 3815 to VIA 3809, (if needed) to differential pathway 3820 located between 00 and to 01 and than on the opposite side is differential conductive mounting pad 6805 (if needed) conductive pathway flow is from 3804 to 3803 to 3805 (if needed) 3809 to differential pathway 3811 located between source 00 and energy-utilizing load 00.

3806 is a Common Conductive Pathway or Electrode

3808 is the external common conductive pathway or area for portion of propagated energy to move to after passing into the AOC and utilizing common conductive pathway elements as described when portions of energy propagate to source 00, if able and will allow additional also work as a low impedance area or said energy EEE to return to source 00, if able.

3809 is a conductive VIA

3811 is a external differential conductive pathway

3813 is a AOC

3815 is a conductive pathway material for attachment means for external differential conductive pathway 3818 and external differential conductive pathway 3804 and 3816 Central common conductive shared pathway or electrode

3817 is a Central commonly shared "0" Voltage reference plane

3818 is a differential conductive pathway or electrode

3819 is a common conductive pathway or electrode

3820 is a external differential conductive pathway

3821A is a conductive material means for the connection of all the common conductive pathways 3806, 3816, 3819 and forms commonly shared "0" Voltage reference plane 3817

3821B is also a conductive material means like 3821A for the connection to the same group of common conductive pathways 3806,3816, 3819 and commonly shared "0" Voltage reference plane 3817. 3824 is a Mutual Inductive Cancellation Portion or H-Field cancellation of energy of UMFCCSS-B shown. The parallel layering starts with one central shared common conductive shield pathway 3816, then working outward from both directions with respect to large conductive surface on either side of 3816, dielectric material 3801, respective conductive pathways 3818 and/or 3804, dielectric material 3801, and respective outer common conductive pathways 3819 and 3806 followed by material 3801. No matter what layering sequence is used in manufacturing the invention, the minimum resulting embodiment for either UMFCCSS-3800-BY-PASS or UMFCCSS-FEED-THRU should have this resulting sequence.

Referring to FIG. 5B which represents the charged electron exchange that serves as a descriptive representation of the electrostatic functions that occur in an energized state to trap parasitics within a shielded container This also is representative of the simultaneous, but opposite charge affect that is occurring along the "skins" of the conductive material that is located with in each respective "container" on opposite sides of the central common and shared conductive pathway 3816. Large conductive arrears located on both the respective sides of 3816 and on one of two large conductive areas of common electrodes 3819 and 3806 that face the respective large areas of conductive material located on each large side of electrode 3816. Energy propagated upon 3818 and 3804 is condition simultaneously in this local in any invention embodiment regardless of the number of conductive containers that are stacked, regardless if multiple conductive pathways are contained such as additional paired plates 3818A and 3804A (NOT Shown) that are arranges in a manner which consists of a plurality of additional differential and paired pathway electrodes interleaved and embedded within a dielectric casing with paired group of differentially operating conductive pathways as a closely spaced pair of conductive elements which significantly increase the total area of paired groups of differentially operating conductive pathways a correspondingly increase in the current handling capacity of the full embodiment will occur. While this disclosure serves well in a UMFCCSS-FEED-THRU USAGE WHERE 3804, 3818 and companion electrodes 3804A, 3818B (not shown) would benefit, in all cases any UMFCCSS-FEED-THRU embodiment will always have electrical current limitations due to the energy flowing through the AOC rather than moving in a by-pass fashion in which all conductively layered electrodes or pathways are being utilized by portions of propagated energy located on opposite sides of the critical centrally positioned common conductive pathway electrode and "0" voltage reference plane. Electrically in parallel means that when attached as disclosed in a manner as revealed herein. An electrically parallel fashion means with respect to the conductive energy pathways utilized by energy propagated from an operating source propagated to the AOC, propagating further to the energy-utilizing source and then, portions of energy are propagated from the energy-utilizing load to the AOC and than portions returning by way of the AOC to source pathways or portions are taken off through the low impedance pathway enhanced by the third conductive set of pathways that are common within the AOC and to one another that leads to the externally positioned common conductive external pathways. As described a properly attached invention whether discrete or non-discrete will aid in achieving a simultaneous ability to perform multiple and distinct energy conditioning functions such as decoupling, filtering, voltage balancing using parallel electrical positioning principals which are always relative to the energy source, paired conductive energy pathways, the energy utilizing load and the conductive energy pathways returning back to the source to complete the circuit. This also includes the opposing but electrically canceling and complimentary positioning of portions of propagated energy acting upon the conductive pathways in a balanced manner on opposite sides of a "0" Voltage reference created simultaneously using the pivotal centrally positioned common and shared conductive electrode pathway. This generally always-parallel energy distribution scheme allows the material make up of all of the manufactured invention elements to operate together more effectively and efficiently with the load and the source pathways located within a circuit. By operating in a balanced manner material stress in significantly reduced as compared to the prior art. Thus phenomena such as elastic material "memory or hysteresis effect in minimized. Piezoelectric effect is also substantially minimized, thus energy is not detoured our inefficiently utilized internally within the AOC and is automatically available for use by the load in a largely dramatic increase in the ability of standard and common dielectric materials to permit functions within the AOC and the circuitry in a broader, less restrictive use, thus reducing costs while allowing performance levels above that of prior art. Testing has confirmed that invention embodiments made in tantalum material can be eliminated as well as the inductive elements needed for their support. This is benefit is due primarily to a combination of factors that have occurred statically and during energization into circuitry. from a static state, the manufacturing of discrete variations of the invention can be done with standard industry manufacturing methodologies and equipment use now. standard and common conductive materials and dielectric materials can be utilized to replace more exotic materials used in prior art to enhance effectiveness. in an energized state minimization of both hysteresis and piezoelectric effects upon dielectric and conductive material stresses within the aoc of the invention translates or equals an increase performance levels for such applications as SSO states, decoupling power systems, quicker utilization of the passive component by the active componentry is also achieved directly attributed to these stress reductions and the balanced manner in which propagated energy is allowed to utilize the UMFCCSS . . . the reduction standard x7r materials can static on, a better and more effect solution for both Bypass, thru-feed-thru and the energy conditioning that takes place between the 3818 and 3804 electrode pathways. central shared common conductive shield pathway electrode 3816 is the balancing point for energy originating (with respect to itself on the generally parallel and opposite sides of 3816, within the structure and will have located in close proximity with respect of the entire 3800 physical 3-dimensional center, a center point of energy conditioning, suppression and shielding. before energization, free electrons are distributed randomly on the outer "skin" of all the conductive pathways all the plates are GnD are in parallel respectively to each other but are lower cap value series to board Now turning to FIG. 5C and FIG. 5D,Moving freely between FIGS, 5A, 5B, 5C and 5D, a disclosure of portions of the AOC circuitry functions of any UMFCCSS in a possible bypass arrangement are shown. FIG. 5C is the graphed response of two 3800 (in-bypass) configured capacitive-type units conducted relative to the related invention elements FIG. 5C shows a test data comparing two universal multi-functional common conductive shield structures with bypass pathways (UMFCCSS-B) 3800-A and 3800B that have been made into a 1206 size package which is a standard package size used by the passive component manufacturing industry for sale of embodiments as a discrete passive component, whether capacitive or inductive the term 1206 is universally understood by those of the art. Embodiments 3800-A and 3800-B are roughly of the same capacitive values. 3800-A and 3800B do not differ significantly in terms of the placement arraignment of any of the conductive pathway electrodes with respect to the common conductive pathway electrodes within. 3800-A and 3800B do not differ significantly with any of the solder material used to physically make the connection. 3800-A and 3800B do not differ significantly in terms of the placement arraignment of any of the common conductive pathway electrodes within, nor differ significantly between the respective conductive terminations structures that are used to connect 3800-A and 3800B into the test circuit.

3800-A and 3800B do differ slightly in the static capacitive value but both differ very significantly by dielectric material used in each units manufacturing process. 3800-A is made with a MOV dielectric with a Mean Average value of Line to Ground capacitance of approx. 912 pF while 3800-B is made with the X7R dielectric with an average lot value of Line to Ground capacitance of approx. 1,000 pF.

3800-A and 3800-B are attached into Test setup circuit similar in function to system 3829 shown in FIG. 5A. FIG. 5C shows the graphed test results as lines 3800-A1, 3800-B1. While capacitor values of 3800-A and 3800-B are similar, the dielectric material is not and yet the test results shown that the more expensive and not as commonly used MOV material takes on a stunning filter effectiveness of the more common X7R material. These test results 3800-A1 and 3800-B1 show that a user of the invention configured like 3800-A will be able to utilize all of the beneficially desired MOV dielectric characteristics of quick clamping of voltage transients and surge suppression capabilities that this particular dielectric is know for in the art. What is unexpected is the apparent unending breadth of the frequency insertion loss response that is shown and obtained with 3800-A using MOV material. Across the frequency spectrum the trend line shows an almost purely capacitive reaction to propagated energy is shown as depicted in the graph line to 1,200 MHz. It should be noted that 1,200 MhZ was the limit of the test equipment used. Trend Lines 3801A-TX7R and 3801-TMOV enhance the almost capacitive response out to the known limit of the test equipment. Surge testing of X7R in the converse fashion, against a liked value MOV and X7R configuration, respectively of 3801-A and 3801-B shows an unexpected ability of X7R dielectric to also react with quick-like MOV transient response characteristics for common mode transients that occur in an energized circuit state. Thus, all embodiments and variations of the invention similarly constructed or manufactured by standard means and used with standard, multiple, paired line circuit situations and having a dielectric difference as the only significant variation between identically configured invention embodiments will yield an insertion loss performance measurement in a manner that is unexpected and unobvious considering the respectively know dielectric material response of prior art. This comparison of like invention units (other than of dielectric material) clearly and unequivocally reveals the primarily reason or factor causing this result and circuit performance is new common conductive shield structure and external conductive attachment elements working in combination in a Gauss-Faraday cage-like fashion using electrostatic suppression, physical shielding and for influencing the conditioning of energy propagated within the circuit system said invention is incorporated into. Thus, discrete and/or non-discreet embodiments using a common conductive shield structure and external conductive attachment elements as disclosed or contemplated and using dielectrics that have been categorized primarily for a certain electrical conditioning function or results will find that usage with the invention elements so arranged herein or inventions constructed with element equivalents will achieve unexpected and beneficial characteristics added to the previously limited usage knowledge of the dielectric material used. This includes any possible layered application that uses non-discreet capacitive or inductive structures that can incorporate a variation of the invention within a manufactured discrete silicon die and the like, for example or a super capacitor application or even an atomic level energy conditioning structure.

FIG. 5D is a data graph comparing various attachments connections and non-attachments non-connections of common conductive termination structures of a universal multi-functional common conductive shield structure with bypass pathways (UMFCCSS-B) that are conductively connected to all common conductive pathway electrodes and an external conductive surface common to all termination structures run out to 500 MhZ in the test circuit system connected in a similar manner to that shown in FIG. 5A and FIG. 5B. Conductive pathway electrodes 3815 (A) and 3803 (B) of the same invention embodiment are measured in relation to four sequential stages of attachment to a common conductive pathway separate of conductive pathway electrodes 3815 (A) and 3803 (B) and externally located (with respect of the AOC). This common conductive pathway extends upward and into the AOC by means of the conductive connection such as 3821A and 3821B that facilitates the low impedance characteristics of the internal conductive pathway electrodes that are created by mutual cancellation of opposing magnetic flux found occurring within an energized, manufactured invention when properly placed into circuitry. These sequential stages of attachment were tested and the results are labeled 3800-1,2,3,4 respectively and are normalized for Insertion loss. Package size utilized is a 1206 Sized layering with a static capacitance rating of 220 pF, Line to Ground constructed in NPO dielectric material. Plot 3800-1 is of attachment to conductive electrode pathway elements 3815 and 3803, ONLY. This test run shows little effect to the energy propagated within the AOC of the invention, however, it is disclosed as shown in FIG. 5A and FIG. 5B that additionally placed common conductive pathways those marked (#-IM) are common conductive electrode pathways commonly attached with the inherent central, shared image "0" voltage reference plane will increase the shielding effectiveness of the invention in many ways. These are additionally placed common conductive pathways located outside the essential groupings of paired conductive shield-like containers and which will again aid to some degree in effecting the energy propagation relative to externally attached common conductive areas. Plot 3800-2 is of attachment to conductive electrode pathway elements 3815 and 3803, and attachment of BOTH 3821A and 3821B to an externally located common conductive carrier ground. When test is performed on 3800-2, only a connection to 3821A is made to common external conductive path and over 46 dB of attenuation with a resonant frequency of 300 MHz is seen. In this configuration the Invention is not really working as UMFCCSS because while the common conductive pathway electrodes within the component are indeed physically in parallel with respect to one another, they are considered actually in series to the external conductive common pathway that is part of the main circuit return or ground. This configuration 3800-2 also shows that the differential pathways are in series conductively with the energy-utilizing load and the energy return pathways of the circuit, despite 3 of 4 terminals connected. The shared common conductive centrally located pathway also becomes un-important and the same as any of the other common plates located within the AOC with respect of the energy conditioning that is taking place. With the series relationship in place for the circuit, common plates are indeed common so much so that a "0" Voltage Image reference function is not achieved, full cancellation of mutual inductance and full electrostatic switching, essential for full parasitic suppression, is not achieved. Once the configuration hits resonance, inductive properties of the invention overwhelm capacitance and prior art performance appears. Thus, the critical nature of the full attachment of all exiting common conductive electrode pathways located or accessible to an external conductive pathway attachment is revealed as very critical in achieving a simultaneous ability to perform multiple and distinct energy conditioning functions such as power and signal decoupling, filtering, voltage balancing using electrical positioning relative to opposite sides of a "0" Voltage reference created on opposite sides of the single centrally positioned common and shared conductive electrode pathway.

As seen when both 3821A and 3821B of the invention are attached to the common conductive external area all common and conductively attached electrode elements allow propagated energy to operate electrically parallel with respect to the source and the load as well as with the other common conductive structures position not only to each other but also with any main circuit return path, chassis ground or low impedance pathway. In this configuration, as revealed this attachment method 3800-3 results in measured the invention resonant frequency moving from 301 MhZ out approximately 86 MHz to 387 MhZ. This would normally be achieved in the prior art components by the addition of more prior art passive comments of different values to achieve the same an equivalent effect. 3800-3 represents the performance improvement achieved with an additional external conductive strap wrapped over the UMFCCSS-B from 3821A TO 3821B and adds an common conductive pathway in parallel to the internal pathways disclosed and thereby again enhances and lowers the impedance of the third conductive and common pathway within the AOC to a propagated energy-return path that can be utilized portions of energy originating from the same source. It should be noted that although internally the conductive pathways are balanced, that once the invention is placed upon the common conductive area created by the puddle solder material placed during the test creates a slight, but unimportant un-balance among the common conductive plates that is noted as non-critical. The addition of the outer conductive strap from 3821A TO 3821B adds back the conductive pathway balance and shifts the self-resonate point out almost another 38 MhZ to from 387 MhZ to 425 MhZ. This configuration is mimicked by additional outer, closely positioned plates 6808-IM and 6810-IM which are placed to enhance a and further shift outward the unit self resonate point. It should be noted that if the container structures that make up an invention are in balanced according to the stacking sequence shown, any added or extra common conductive shield structure that is added by mistake or with forethought will not sufficiently hamper or degrade energy conditioning configurations and actually reveal a potential cost savings in the manufacturing process wherein automated layer processes could possibly added the additional outer layer or layers as described. It is disclosed that these errors intentional or accidental will not determent ally harm the balance of the invention containing the properly sequenced stacking of containers as discussed and is fully contemplated by the applicants.

At least three, distinctly different energy conditioning functions will occur within any variation of the UMFCCSS; electrostatic minimization of energy parasitics by almost total shield envelopment; physical shielding of differential conductive pathways; electromagnetic shielding function or mutual magnetic flux cancellation of opposing differential conductive pathways; use of a "0" voltage reference created by the central, common and shared pathway electrode that is part of two distinct common conductive shield structures, the parallel movement shielding effect as opposed to a series movement effect by a majority of the portions of energy using the AOC in which each energy portion operating on one side of the central common and shared conductive energy pathway in a electrical and/or magnetic operation will have a parallel non-reinforcing counterpart that operates in a generally opposing cancellation-type manner that does not reinforce detrimental forces in a manner like that of the prior art which operates in a generally series-type manner which may use mutual magnetic flux cancellation of opposing differential conductive pathway but fails to use the simultaneous sandwiching electrostatic shielding function as has been described in this disclosure.

Second, in all embodiments whether shown or not, the number of pathways, both common conductive pathway electrodes and differential conductive pathway electrodes, can be multiplied in a predetermined manner to create a number of conductive pathway element combinations a generally physical parallel relationship that also be considered electrically parallel in relationship with respect to these elements in an energized existence with respect to a circuit source will most additionally in parallel which thereby add to create increased capacitance values.

Third, additional common conductive pathways surrounding the combination of a center conductive pathway and a plurality of conductive electrodes are employed to provide an increased inherent ground and optimized Faraday cage-like function and surge dissipation area in all embodiments.

Fourth, although a minimum of one central common conductive shield paired with two additionally positioned common conductive pathways or shields are generally desired and should be positioned on opposite sides of the central common conductive shield (other elements such as dielectric material and differential conductive electrodes can be located between these shields as described). Additional common conductive pathways can be employed with any of the embodiments shown and is fully contemplated by Applicant. In fact the multi-functional energy conditioner, although not shown, could easily be fabricated in silicon and directly incorporated into integrated circuits for use in such applications as communication microprocessor integrated circuitry or chips. Integrated circuits are already being made having capacitors etched within the silicone foundation which allows the architecture of the present invention to readily be incorporated with technology available today.

The multi-functional energy conditioner can also be embedded and filter communication or data lines directly from their circuit board terminal connections, thus reducing circuit board real estate requirements and further reducing overall circuit size while having simpler production requirements. Finally, from a review of the numerous embodiments it should be apparent that the shape, thickness or size may be varied depending on the electrical characteristics desired or upon the application in which the filter is to be used due to the physical architecture derived from the arrangement of common conductive electrode pathways and their attachment structures that form at least one single conductively homogenous faraday cage-like structure and other conductive electrode pathways.

Although the principals, preferred embodiments and preferred operation of the present invention have been described in detail herein, this is not to be construed as being limited to the particular illustrative forms disclosed. It will thus become apparent to those skilled in the art that various modifications of the preferred embodiments herein can be made without departing from the spirit or scope of the invention as defined by the appended claims

What is claimed is:

1. An electrode arrangement, comprising:
    a first plurality of electrodes of substantially equal size and shape coupled conductively to each other, and wherein the first plurality of electrodes are aligned and parallel with one another;
    a second plurality of electrodes of substantially equal size and shape coupled conductively to each other, and wherein the second plurality of electrodes are aligned and parallel with one another;
    a third plurality of electrodes of substantially equal size and shape that are coupled conductively to each other, and wherein the third plurality of electrodes are aligned and parallel with one another;
    a first electrode of the first plurality of electrodes is positioned below a first electrode of the second plurality of electrodes, and a second electrode of the first plurality of electrodes is positioned above the first electrode of the second plurality of electrodes, and a first electrode of the third plurality of electrodes is positioned above the second electrode of the first plurality of electrodes, and a third electrode of the first plurality of electrodes is positioned above the first electrode of the third plurality of electrodes, and a second electrode of the second plurality of electrodes is positioned above the third electrode of the first plurality of electrodes, and a fourth electrode of the first plurality of electrodes is positioned above the second electrode of the second plurality of electrodes, and a second electrode of the third plurality of electrodes is positioned above the fourth electrode of the first plurality of electrodes, and a fifth electrode of the first plurality of electrodes is positioned above the second electrode of the third plurality of electrodes;

wherein the electrodes of the second plurality of electrodes and electrodes of the third plurality of electrodes are of substantially equal size and shape and wherein any one electrode of either the second plurality of electrodes or of the third plurality of electrodes, is smaller than any one electrode of the first plurality of electrodes; and wherein any one electrode of the second plurality of electrodes and any one electrode of the third plurality of electrodes are shielded from one another by at least one electrode of the third plurality of electrodes.

2. The electrode arrangement according to claim 1, comprising;

a means for preventing conductive coupling of either the second plurality of electrodes or the third plurality of electrodes to the first plurality of electrodes within the electrode arrangement.

3. The electrode arrangement according to claim 2 in which the second plurality of electrodes is isolated conductively from the third plurality of electrodes.

4. The electrode arrangement according to claim 2 in which the second plurality of electrodes and the third plurality of electrodes are inset within the third plurality of electrodes except for at least one electrode portion of each electrode of the any one electrode of both the second plurality of electrodes and the third plurality of electrodes; and wherein the at least one electrode portion extends outwardly beyond at least a common alignment of the third plurality of electrodes.

5. A circuit comprising the electrode arrangement according to claim 3.

6. The electrode arrangement of claim 3 operable as a portion of a capacitive network.

7. The circuit of claim 5 operable as a portion of a capacitive network.

8. The electrode arrangement according to claim 1, wherein the number of all of the electrodes of the first plurality of electrodes is an odd integer number.

9. The electrode arrangement according to claim 1, wherein the total number of the electrodes of the second plurality of electrodes and the third plurality of electrodes is an even integer number.

10. The electrode arrangement according to claim 1, wherein the total number of the electrodes of the first plurality of electrodes, the second plurality of electrodes and the third plurality of electrodes is an odd integer number.

11. The electrode arrangement according to claim 3, wherein the means for preventing conductive coupling is a material with insulating properties.

12. The electrode arrangement of claim 4, wherein the first plurality of electrodes, the second plurality of electrodes, and the third plurality of electrodes are operable for maintaining voltage balance between an energy source and an energy-utilizing load.

13. The electrode arrangement according to claim 1, wherein a sixth electrode of the first plurality of electrodes is positioned below the first electrode of the first plurality of electrodes; and wherein a seventh electrode of the first plurality of electrodes is positioned above the fifth electrode of the first plurality of electrodes.

14. The electrode arrangement according to claim 11, wherein a sixth electrode of the first plurality of electrodes is positioned below the first electrode of the first plurality of electrodes; and wherein a seventh electrode of the first plurality of electrodes is positioned above the fifth electrode of the first plurality of electrodes.

15. The electrode arrangement according to claim 3, wherein a sixth electrode of the first plurality of electrodes is positioned below the first electrode of the first plurality of electrodes; and wherein a seventh electrode of the first plurality of electrodes is positioned above the fifth electrode of the first plurality of electrodes.

* * * * *

UNITED STATES PATENT AND TRADEMARK OFFICE
CERTIFICATE OF CORRECTION

PATENT NO. : 6,636,406 B1
DATED : October 21, 2003
INVENTOR(S) : Anthony A. Anthony et al.

It is certified that error appears in the above-identified patent and that said Letters Patent is hereby corrected as shown below:

<u>Title page,</u>
Item [75], should read
-- [75] Inventor: Anthony A. Anthony, Erie, PA (US);
                William M. Anthony, Erie, PA (US) --

Item [63], should read
-- [63] Continuation-in-part of application No. 09/600,530, filed as application No. PCT/US99/01040 on Jan. 16, 1999, application No. 09/594,447 is also a continuation-in-part of application No. 09/579,606, filed on May 26, 2000, which is a continuation-in-part of application No. 09/460,218, filed on Dec. 13, 1999, which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350. --

Signed and Sealed this

Twentieth Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,636,406 B1
DATED : October 21, 2003
INVENTOR(S) : Anthony A. Anthony It is certified that error appears in the above-identified patent and that said Letters Patent is hereby corrected as shown below:

Title page,
Item [63], reading "Continuation-in-part of application No. 09/600,530, filed as application No. PCT/US99/01040 on Jan. 16, 1999, application No. 09/594,447 is also a continuation-in-part of application No. 09/579,606, filed on May 26, 2000, which is a continuation-in-part of application No. 09/460,218, filed on Dec. 13, 1999, which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350."

should read:

-- Continuation-in-part of application No. 09/600,530, now Pat. No. 6,498,710, which is a US national stage application of international application PCT/US99/01040 filed on Jan. 16, 1999, which is a continuation-in-part of application No. 09/056,379, filed on Apr. 7, 1998, now Pat. No. 6,018,448, which is a continuation-in-part of application No. 09/008,769, filed Jan. 19, 1998, now Pat. No. 6,097,581, which is a continuation-in-part of application No. 08/841,940, filed on Apr. 8, 1997, now Pat. No. 5,909,350; application No. 09/594,447 is also a continuation-in-part of application No. 09/579,606, filed on May 26, 2000, now Pat. No. 6,373,673, which is a continuation-in-part of application No. 09/460,218, filed on Dec. 13, 1999, now Pat. No. 6,331,926 which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350; and application 09/579,606 is also a continuation in part of application No. 09/600,530, now Pat. No. 6,498,710, which is a US national stage application of international application PCT/US99/01040 filed on Jan. 16, 1999, which is a continuation-in-part of application No. 09/056,379, filed on Apr. 7, 1998, now Pat. No. 6,018,448, which is a continuation-in-part of application No. 09/008,769, filed Jan. 19, 1998, now Pat. No. 6,097,581, which is a continuation-in-part of application No. 08/841,940, filed on Apr. 8, 1997, now Pat. No. 5,909,350. --

Column 1,
Lines 6-19, reading "This application is a continuation-in-part of co-pending application Ser. No. 09/600,530 filed Jul. 18, 2000, which is a U.S. national stage application of international application PCT/US99/01040 filed Jan. 16, 1999; this application is also a continuation-in-part of copending application Ser. No. 09/579,606 filed May 26, 2000 which is a continuation-in-part of copending application Ser. No. 09/460,218 filed Dec. 13, 1999, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998 now U.S. Pat. No. 6,097,581, which is a continuation-in-part of application Ser. No. 08/841,940 filed Apr. 8, 1997, now issued as U.S. Pat. No. 5,909,350."

UNITED STATES PATENT AND TRADEMARK OFFICE
CERTIFICATE OF CORRECTION

PATENT NO. : 6,636,406 B1
DATED : October 21, 2003
INVENTOR(S) : Anthony A. Anthony It is certified that error appears in the above-identified patent and that said Letters Patent is hereby corrected as shown below:

Column 1 (cont'd),
should read:
-- This application is a continuation-in-part of co-pending application Ser. No. 09/600,530 filed Jul. 18, 2000, now U.S. Pat. No. 6,498,710, which is a U.S. national stage application of international application PCT/US99/01040 filed Jan. 16, 1999, which is a continuation-in-part of application No. 09/056,379, filed on Apr. 7, 1998, now Pat. No. 6,018,448, which is a continuation-in-part of application No. 09/008,769, filed Jan. 19, 1998, now Pat. No. 6,097,581, which is a continuation-in-part of application No. 08/841,940, filed on Apr. 8, 1997, now Pat. No. 5,909,350; this application is also a continuation-in-part of application Ser. No. 09/579,606 filed May 26, 2000, now Pat. No. 6,373,673, which is a continuation-in-part of application Ser. No. 09/460,218 filed Dec. 13, 1999, now Pat. No. 6,331,926, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998 now U.S. Pat. No. 6,097,581, which is a continuation-in-part of application Ser. No. 08/841,940 filed Apr. 8, 1997, now issued as U.S. Pat. No. 5,909,350; and application 09/579,606 is also a continuation in part of application No. 09/600,530, now Pat. No. 6,498,710, which is a US national stage application of international application PCT/US99/01040 filed on Jan. 16, 1999, which is a continuation-in-part of application No. 09/056,379, filed on Apr. 7, 1998, now Pat. No. 6,018,448, which is a continuation-in-part of application No. 09/008,769, filed Jan. 19, 1998, now Pat. No. 6,097,581, which is a continuation-in-part of application No. 08/841,940, filed on Apr. 8, 1997, now Pat. No. 5,909,350.--

Signed and Sealed this

Twelfth Day of April, 2005

JON W. DUDAS
*Director of the United States Patent and Trademark Office*